United States Patent
Burns et al.

(10) Patent No.: US 6,653,371 B1
(45) Date of Patent: Nov. 25, 2003

(54) ONE-PART CURABLE COMPOSITION OF POLYEPOXIDE, POLYTHIOL, LATENT HARDENER AND SOLID ORGANIC ACID

(76) Inventors: Barry E. Burns, 60 Lower Mountpleasant Avenue, Rathmines, Dublin 6 (IE); Harry Woolfson, 55 Sanford Road, Ranelagh, Dublin 6 (IE); Paul Malone, 14, Mount Alton, Knocklyon, Dublin 16 (IE); Jonathan Wigham, 46 Glenbrook Park, Rathfarnham, Dublin 14 (IE)

( * ) Notice: Subject to any disclaimer, the term of this patent is extended or adjusted under 35 U.S.C. 154(b) by 0 days.

(21) Appl. No.: 09/600,425
(22) PCT Filed: Jan. 14, 1999
(86) PCT No.: PCT/IE00/00001
§ 371 (c)(1), (2), (4) Date: Jul. 13, 2000
(87) PCT Pub. No.: WO99/36484
PCT Pub. Date: Jul. 22, 1999

(30) Foreign Application Priority Data

Jan. 16, 1998 (IE) .................................................. 980028

(51) Int. Cl.[7] ......................... C08K 5/09; C08K 5/3462; C08L 63/00; C08L 63/02
(52) U.S. Cl. ...................... 523/455; 523/456; 525/504; 525/505; 525/508; 525/523; 525/526; 525/528; 525/533
(58) Field of Search ................................ 525/526, 504, 525/505, 508, 523, 528, 533; 523/455, 456

(56) References Cited

U.S. PATENT DOCUMENTS

| | | | |
|---|---|---|---|
| 3,597,410 A | 8/1971 | Lieske et al. ......... 260/77.5 R |
| 4,546,155 A | * 10/1985 | Hirose et al. ............... 525/504 |
| 5,077,376 A | * 12/1991 | Dooley ....................... 528/111 |
| 5,430,112 A | 7/1995 | Sakata et al. ............... 525/526 |

FOREIGN PATENT DOCUMENTS

| | | |
|---|---|---|
| EP | 566780 A1 * | 10/1993 |
| JP | 56-57820 | 5/1981 |
| JP | 56-57820 A * | 5/1981 |
| JP | 01-29416 | 1/1989 |
| JP | 03172343 | 7/1991 |
| JP | 04206402 | 7/1992 |
| JP | 5-112632 A2 * | 5/1993 |

* cited by examiner

Primary Examiner—Robert E. L. Sellers

(57) ABSTRACT

This invention relates to curable epoxy-based compositions for use in the field of microelectronics, such as those having an epoxy compound which has two or more epoxy groups per molecule, a polythiol compound which has two or more thiol groups per molecule, a latent hardener, and at least one solid organic acid which is substantially insoluble in a mixture of the foregoing components at room temperature. The solid organic acid may be selected from the group consisting of: aliphatic, cycloaliphatic and aromatic carboxylic acids and derivatives thereof, aliphatic, cycloaliphatic, and aromatic quinones and derivatives thereof, phenols and derivatives thereof and enolisable aliphatic, cycloaliphatic and aromatic compounds and derivatives thereof. The solid organic acid should have a pKa of less than or equal to about 12.0, desirably less than or equal to about 10, and often less than or equal to 9.0, such as less than or equal to about 7.5. The invention also relates to curable epoxy-based compositions including an epoxy compound, a thixotropy-conferring component, a latent hardener and at least one of the solid organic acids above demonstrating improved rheological properties such as yield point maintenance and viscosity maintenance over time.

17 Claims, 3 Drawing Sheets

ONE-PART CURABLE COMPOSITION OF POLYEPOXIDE, POLYTHIOL, LATENT HARDENER AND SOLID ORGANIC ACID

BACKGROUND OF THE INVENTION

1. Field of the Invention

This invention relates to curable epoxy-based compositions such as those having an epoxy compound which has two or more epoxy groups per molecule, a polythiol compound which has two or more thiol groups per molecule, a latent hardener, and at least one solid organic acid which is substantially insoluble in a mixture of the foregoing components at room temperature. The solid organic acid may be selected from the group consisting of: aliphatic, cycloaliphatic and aromatic carboxylic acids and derivatives thereof, aliphatic, cycloaliphatic, and aromatic quinones and derivatives thereof, phenols and derivatives thereof and enolisable aliphatic, cycloaliphatic and aromatic compounds and derivatives thereof. The solid organic acid should have a pKa of less than or equal to about 12.0, suitably less than or equal to 10, such as less than or equal to about 9.0, and often less than or equal to about 7.5.

In another aspect of this invention, there are provided curable one-part epoxy-based compositions with improved rheological properties, such as improved shelf-life stability, particularly with respect to yield point maintenance over time, viscosity maintenance over time, and room temperature pot life.

2. Brief Description of Related Technology

Curable epoxy-based compositions are well known. Such compositions are used as adhesives, coating agents, sealing agents and may also be used as casting agents. Epoxy-based compositions are also used in the electronics industry for the fabrication of heat resistant printed circuit laminates for printed circuit boards (pcbs). One use of curable epoxy compositions is to bond surface mount components to pcbs.

Epoxy/polythiol-containing compositions conventionally have been used as two-part compositions. This was due at least in part to the instability of a one-part composition, having an epoxy resin and a polythiol component and a liquid (soluble) tertiary amine curing agent or hardener. One-part compositions of this sort where the epoxy resin-polythiol and the curing agent or hardener were admixed at room temperature had working or "pot" lives on the order of minutes to a few hours. These properties impose practical restrictions on end-use applications of such compositions. Accordingly, many traditional epoxy/polythiol compositions have been formulated as two-part compositions.

Commercially available latent curing agents used in one-part epoxy resin adhesive formulations ordinarily provide such formulations with a combination of good storage stability and moderate reactivity at elevated temperatures. Examples of such commercially available latent curing agents include dicyandiamide and dibasic acid dihydrazide. These curing agents are useful in formulating epoxy resin compositions with excellent storage stability. However to achieve cure, these curing agents ordinarily require heating to temperatures greater than 150° C. for extended periods of time.

U.S. Pat. No. 5,430,112 (Sakata) discloses epoxy resin/polythiol compositions which are reported to display enhanced stability, i.e. an extended pot life, if (a) a solid dispersion-type amine adduct latent curing accelerator, or (b) the product of a reaction between a compound which contains one or more isocyanate groups in its molecule and a compound which has two or more primary and/or secondary amino groups in its molecule, is used. The compounds (a) and (b) above are each reported to act as a "latent hardener" being activatable at higher temperatures. In particular, the composition disclosed in the '112 patent contains (1) an epoxy resin which has two or more epoxy groups in its molecule, (2) a polythiol compound which has two or more thiol groups in its molecule and (3) an accelerator which is (a) a solid dispersion-type amine adduct latent curing accelerator, or (b) the product of a reaction between a compound which contains one or more isocyanate groups in its molecule and a compound which has at least one primary and/or secondary amino groups in its molecule. Examples given of commercially available solid dispersion-type amine adduct latent curing accelerators are those sold under the trade names Ajicure PN-H or Ajicure PN-23 (commercially available from Ajinomoto Co., Inc., Tokyo, Japan). The compositions containing these amine adduct latent curing accelerators show improved room temperature stability over conventional formulations based on liquid or soluble tertiary amine curing agents. However, in practice such compositions with a pot life of in excess of 1 week at room temperature, show a poor ability to cure, i.e. their ability to cure in less than 30 mins at 80° C. is poor.

The stability of an epoxy resin/polythiol composition of the '112 patent is reported to be improved by the use of a solid dispersion-type amine adduct latent curing accelerator and/or the product of a reaction between an isocyanate and an amine containing group, though compositions containing Ajicure PN-23 are not described. However, improved stability, for at least the commercially available Ajicure PN-H, is achieved at the expense of gel time, i.e. greater stability is achieved only with an undesirable effect of increase in gel time.

The '112 patent also describes the use of liquid or solid organic or inorganic acids for surface treating the latent hardener (the amine adduct) and for use in making the latent hardener. The treatment of the hardener with an acid is designed to neutralise active basic materials on the surface of the hardener particles as the hardener is ordinarily in a solid state. The organic or inorganic acid is often in a liquid state or in a solution to allow for the surface treatment, or for making the latent hardener.

An English-language abstract (produced by Derwent) (accession no. 86-229126) for Japanese laid-open patent application no. S61-159417 (Japanese Patent No. 92014701) discloses a two-part curable epoxy resin composition containing epoxy compounds having on average above one epoxy group in one molecule, thiol compounds containing about one thiol group in one molecule as a hardener (though not a latent one), amines as a curing accelerator and mercapto-organic acids containing one carboxylic group and one thio group in one molecule as a curing retarder.

As regards increasing the gel times for two-part epoxy compositions Japanese patent publication no. 56057820 describes such a composition which contains an epoxy compound, a thiol compound as curing agent, an amine as curing accelerator, and an acid, added to retard the curing reaction. The composition is not suitable for formulation as a one-part composition as the amines used are not latent, and as such cause the composition to cure within a few minutes of the two parts of the composition being brought together. The JP '820 publication appears to be concerned with providing two-part compositions with increased gel times achieved when the two parts are brought together. This allows the mixed composition to be used for longer periods.

The increased gel times are achieved by the addition of the acid component such as liquid acids and Lewis acids. The JP '820 publication does not appear to be concerned with providing storage stable compositions, and does not appear to teach achieving storage stability concomitantly with retention of relatively short gel times.

In the electronics industry, it is desirable to provide epoxy-based compositions with thermal cure profiles tailored to specific application temperature requirements. Such cure profile tailoring assists in maintaining the integrity of the electronic components during the bonding process of the components to a pcb. In addition, it is desirable for such compositions to have extended room temperature pot lives so that the composition may be repeatedly applied to the surface of the pcb. This prolongs the useable application life of the compositions, thereby ensuring reproducible dispensing properties.

Advances in the electronics industry have made precise deposition of surface mount adhesives a critical processing parameter, particularly in view of high throughput demand and process efficiency. The increasingly popular smaller-sized microelectronic components has made precise deposition of solder or adhesives onto circuit boards for chip attachment that much more important. Where precise adhesive deposition does not occur—either due to adhesive deposition technique imprecision, or spreading of the adhesive due to inappropriate rheological properties for the particular application, or both—surface mounting of components on pcbs may not occur at all, and even when mounting does occur, the mounting may not occur in a commercially-acceptable manner.

With certain applications, such as the applications in the electronics industry mentioned above, it has also become desirable for epoxy-based compositions to have a defined structural integrity. One way to achieve this is through the addition of a thixotropy-conferring agent, such as a clay or a silica, a large number of which are well-known. Indeed, Degussa makes available commercially a number of treated fumed silicas under the tradename "AEROSIL", and has suggested their use to impart in epoxy resins a thickening and thixotropic effect. See also, C. D. Wright and J. M. Muggee, "Epoxy Structural Adhesives", in *Structural Adhesives: Chemistry and Technology*, S. R. Hartshorn, ed., 113–79, 131 (1986).

Heretofore, the desirability of balancing reactivity with pot life in curable one-component epoxy-based compositions has been recognised. For instance, U.S. Pat. No. 3,597,410 (Lieske) discloses a method of prolonging the period of reaction of hardenable mixtures based on hardenable epoxide resins by providing an amount of a barbituric compound effective to retard cure. The compositions are otherwise relatively slow curing at elevated temperatures. The compositions of the '410 patent include hardenable epoxides containing more than one epoxide group in the molecule, together with an organic polycarboxylic acid anhydride epoxide resin hardener and an amount of a barbituric compound effective to retard cure. The object of the '410 patent is said to be prolonging the period of reaction or pot life, and retarding the hardening of the epoxy composition at elevated temperatures.

U.S. Pat. No. 5,130,407 (Lee) relates to an epoxy resin composition used for the fabrication of a heat resistant circuit laminate for printed circuit boards. The composition used is a modified epoxy resin which is obtained by reacting an epoxy resin with a mono-nucleus N-heterocyclic fatty compound as a chain extender, a polyfunctional epoxy resin and curing agents. Barbituric acid is mentioned as a possible chain extender.

U.S. Pat. No. 5,268,432 (Pan) relates to a heat resistant adhesive composition containing a bismaleimide in a composition which may be modified by barbituric acid for bonding a 3-layer flexible printed circuit.

United Kingdom Patent Application No. 2 287 940 refers to a liquid epoxy resin composition for bonding electronic parts onto printed wiring boards using a dispenser. The composition includes an epoxy resin, an amine curing agent, an inorganic filler (such as calcined talc) and an organic rheology additive (such as modified castor oil or an organic amide).

European Patent Application No. 459 614 refers to an epoxy resin composition of an epoxy resin, an amine-type latent curing agent and a hydrophilic silica. The compositions, having good shape retention, may be prepared by blending the components until a thixotropy index of 2 or less is achieved. The thixotropy index is given in the EP '614 application as a ratio of the viscosity measured at 25° C. and 0.5 rpm over the viscosity measured at 25° C. and 5 rpm. In addition, an index of the degree of viscosity change over time ("the thixotropy index changing ratio") is given in the EP '614 application.

Notwithstanding the state of the art it would still be desirable to provide epoxy compositions with improved storage stability, such as improved room temperature pot life and with extended working lives and relatively short curing times. It would also be desirable to provide compositions with improved rheological properties, such as improved shelf-life stability, particularly with respect to yield point maintenance over time, viscosity maintenance over time, in addition to storage stability. Compositions having some or all of these properties are very useful commercially, as noted above.

SUMMARY OF THE INVENTION

In a first aspect of the present invention there is provided epoxy/polythiol compositions with improved storage stability, and with extended working lives and relatively short curing times at relatively low temperatures. These compositions provide an increase in the stability by prolonging pot life without substantially affecting gel-times. The compositions exhibit good adhesive strengths when cured.

More specifically, in this first aspect of the present invention, the epoxy resin compositions include:

(a) an epoxy compound which has two or more epoxy groups per molecule, (b) a polythiol compound which has two or more thiol groups per molecule, (c) a latent hardener, and (d) at least one solid organic acid which is substantially insoluble in a mixture of (a), (b) and (c) above, at room temperature.

Suitably, the solubility of the acid in a mixture of (a), (b) and (c) above increases at a temperature above room temperature.

In these inventive compositions, the solid organic acid may have a pKa less than or equal to about 12.0, desirably less than or equal to about 10, and often less than or equal to about 9.0, such as less than or equal to about 7.5.

In addition, the solid organic acid may be selected from at least one of the following solid organic acids: aliphatic, cycloaliphatic and aromatic carboxylic acids and derivatives thereof, aliphatic, cycloaliphatic and aromatic quinones and derivatives thereof, phenols and derivatives thereof and enolisable aliphatic, cycloaliphatic and aromatic compounds and derivatives thereof. Suitably the solid organic acid selected is substantially insoluble in a mixture of (a), (b) and (c), at room temperature.

The invention also relates to use of a solid organic acid in the preparation of a one-part adhesive composition based on an epoxy resin.

Compositions of this first aspect of the invention may be imparted with improved rheological properties by including:

(e) a thixotropy-imparting agent.

Compositions further comprising the thixotropy-imparting agent retain properties such as storage stabilising and low temperature cure.

In a second aspect of the invention there is provided a curable one-part epoxy resin compositions comprising:

(i) an epoxy component comprising at least one epoxy compound, (ii) a latent hardener component, (iii) a thixotropy-conferring component, and (iv) a solid organic acid component.

These compositions show improved rheological properties. Components (i), (ii) and (iv) of this composition correspond to components (a), (c) and the acid referred to in component (d) above respectively with respect to the first aspect of the invention. Component (iii) corresponds to the thixotropy imparting agent (e) above.

In this second aspect, the solid organic acid is also effective to improve rheological properties of compositions which do not necessarily contain a polythiol compound. The rheological properties referred to include those such as improved shelf-life stability, particularly with respect to yield point maintenance over time, viscosity maintenance over time, and room temperature pot life. In particular, the solid organic acid initially enhances the yield point and stabilises the yield point of the composition over time beyond that which is observed from compositions which do not include the solid organic acids used in both aspects of the present invention. The yield point (or yield stress) may generally be thought of as the minimum stress required to cause a material to flow. The solid organic acid stabilises both the chemical and physical properties of the epoxy resin compositions of the present invention, an effect which is quantifiable by the properties given above. The term 'epoxy resin compositions of the present invention' as used herein refers to compositions of the first aspect of the invention including those further comprising the thixotropy-conferring component, and to the compositions of the second aspect of the invention also. The term further includes such compositions having added one or more further components.

The present invention also provides reaction products of the epoxy resin compositions, which exhibit good adhesive strengths when cured.

In a practical application, epoxy resin compositions of the present invention may be used as an underfilling sealing resin. In this application, the compositions enable a semiconductor device, such as a chip scale package/ball grid array (CSP/BGA) assembly, which includes a semiconductor chip mounted on a carrier substrate, to be securely connected to a circuit board by short-time heat curing.

The invention also provides a method of preparing such epoxy resin compositions, and a method of using such epoxy-resin compositions in the manufacture of electronic mounting structure, as for instance surface mount adhesives.

The words "comprises/comprising" and the words "having/including" when used herein with reference to the present invention are used to specify the presence of stated features, integers, steps or components but do not preclude the presence or addition of one or more other features, integers, steps, components or groups thereof.

The present invention will be more fully understood by a reading of the Detailed Description of the Invention, together with the Figures which follow.

DETAILED DESCRIPTION OF THE INVENTION

Figure 1:
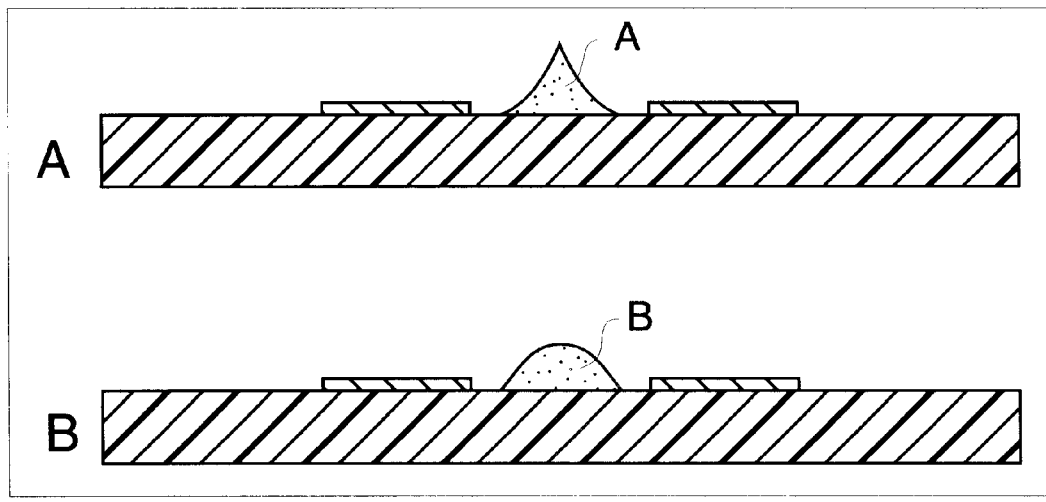
FIG. 1 is two schematic diagrams A and B showing a substrate with a dot of adhesive composition applied thereto and depicting dot profiles of adhesive compositions, the upper one of which has been stabilised against yield point decreases (Dot A) and the lower of which has not been so stabilised (Dot B).

Discussion of the epoxy resin compositions of the present invention.

The first aspect of the present invention provides an epoxy resin composition comprising an epoxy compound which has two or more epoxy groups per molecule, a polythiol compound which has two or more thiol groups per molecule, a latent hardener and at least one solid organic acid which is substantially insoluble in a mixture of the epoxy compound, polythiol and latent hardener.

The epoxy resin compositions of the present invention show improved ambient storage stability and show extended room temperature working lives. The compositions of the first aspect of the invention which comprise a polythiol compound retain good low temperature curability, for example at 80–85° C., even when component (e) the thixotropy-conferring component is added. This composition has thus the combined desirable properties: low temperature cure; storage stability; and rheological stability.

The second aspect of the present invention provides an epoxy resin composition comprising an epoxy compound which has two or more epoxy groups per molecule, a latent hardener, a thixotropy-conferring agent, and at least one solid organic acid which is desirably substantially insoluble in a mixture of the epoxy compound, and latent hardener.

The epoxy resin compositions of the second aspect of the present invention may ordinarily be cured by heating to a temperature in the range of about 100 to about 180° C. for a period of time of about 0.5 to 60 minutes. However, generally after application of the composition, a cure time of about 3 minutes at about 125° C. is sufficient to set up the composition, with complete cure observed after about 10 to about 15 minutes at that temperature. Of course, this cure profile may vary depending on the chosen components and the specifications established by the end user.

Epoxy resin compositions of the present invention can be used at relatively moderate temperatures and short-time curing conditions, and hence achieve very good productivity. The compositions show good curability at moderate temperatures, and may be formulated as either one-part or two-part compositions.

The epoxy resin compositions of the first aspect of the present invention may be produced by the method illustrated in Examples 1 to 49 below. That is, admixing the solid organic acid, the latent hardener, the epoxy, the polythiol and optionally the thixotropy-conferring component. Desirably, the solid organic acid should be added to the composition prior to the addition of the latent hardener.

The epoxy resin compositions of the second aspect of the present invention may be produced by the method illustrated in Sections V and VI below. Desirably the acid component is combined with the epoxy component before addition of the thixotropy-conferring component.

Discussion of the epoxy resin component:

The epoxy compound for the epoxy resin compositions of the present invention may be selected from any polymeric epoxide which has an average of two or more epoxide groups per molecule, including polyglycidyl ethers of polyhydric phenols, for example, polyglycidyl ethers of bisphenol A, bisphenol F, bisphenol AD, catechol, resorcinol. Epoxy compounds obtained by reacting polyhydric alcohols such as butanediol or polyethylene glycol or glycerin with epichlorohydrin, are also suitable. Epoxidised (poly)olefinic resins, epoxidised phenolic novolac resins, epoxidised cresol novolac resins and cycloaliphatic epoxy resins may also be used. Also included are polyglycidyl ether esters, such as those obtained by reacting hydroxycarboxylic acid with epichlorohydrin, and polyglycidyl esters, such as those obtained by reacting a polycarboxylic acid with epichlorohydrin. Urethane modified epoxy resins are also suitable. Other suitable epoxy compounds include polyepoxy compounds based on aromatic amines and epichlorohydrin, such as N,N'-diglycidyl-aniline; N,N'-dimethyl-N,N'-diglycidyl-4,4'diaminodiphenyl methane; N,N,N',N'-tetraglycidyl-4,4'diaminodiphenyl methane; N-diglycidyl-4-aminophenyl glycidyl ether; and N,N,N',N'-tetraglycidyl-1,3-propylene bis-4-aminobenzoate. Combinations of these epoxy compounds may be used. Among the epoxy resins suitable for use herein are polyglycidyl derivatives of phenolic compounds, such as those available commercially under the trade names EPON 828, EPON 1001, EPON 1009, and EPON 1031, from Shell Chemical Co.; DER 331, DER 332, DER 334, and DER 542 from Dow Chemical Co.; and BREN-S from Nippon Kayaku, Japan. Other suitable epoxy resins include polyepoxides prepared from polyols and the like and polyglycidyl derivatives of phenol-formaldehyde novolacs, the latter of which are available commercially under the trade names DEN 431, DEN 438, and DEN 439 from Dow Chemical Company. Cresol analogs are also available commercially ECN 1235, ECH 1273, and ECN 1299 from Ciba-Geigy Corporation. SU-8 is a bisphenol A-type epoxy novolac available from Interez, Inc. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba-Geigy Corporation and PGA-X and PGA-C from the Sherwin Williams Co. Epoxy resins are discussed in U.S. Pat. No. 5,430,112 the entire contents of which are hereby incorporated herein.

Within the epoxy component may be included appropriate reactive diluents which include monofunctional or certain multifunctional epoxy resins. The reactive diluent should have a viscosity which is lower than that of the epoxy compounds within the epoxy component having at least two epoxy groups. Ordinarily, the reactive diluent should have a viscosity less than about 250 mPa.s (cPs). In the event such a monofunctional epoxy resin is included within the epoxy component as a reactive diluent, such mono-functional epoxy resin should be employed in an amount of up to about 50 parts based on the total of the epoxy resin component.

The monofunctional epoxy resin should have an epoxy group with an alkyl group of about 6 to about 28 carbon atoms, examples of which include $C_6$–$C_{28}$ alkyl glycidyl ethers, $C_6$–$C_{28}$ fatty acid glycidyl esters and $C_6$–$C_{28}$ alkylphenol glycidyl ethers.

Commercially available monofunctional epoxy resin reactive diluents include those from Pacific Epoxy Polymers, Richmond, Mo., under the trade designations PEP-6770 (glycidyl ester of neodecandoic acid), PEP-6740 (phenyl glycidyl ether) and PEP-6741 (butyl glycidyl ether).

Commercially available reactive diluents include those from Pacific Epoxy Polymers, under the trade designations PEP-6752 (trimethylolpropane triglycidyl ether) and PEP-6760 (diglycidyl aniline).

Suitably the epoxy resin is present in amounts of about 40 to about 80% based on the total weight of the composition, such as about 45 to about 70%. It should be noted that the amounts of a given component mentioned generally apply to compositions of the first and second aspects of the invention.

Discussion of the polythiol component:

The polythiol compound for compositions of the first aspect of the invention may be selected from any mercapto compound which has two or more thiol groups per molecule, such as trimethylolpropane tris (β-mercaptopropionate), trimethylolpropane tris (thioglycolate), pentaerythritol tetrakis (thioglycolate), pentaerythritol tetrakis (β-mercaptopropionate), dipentaerythritol poly (β-mercaptopropionate), ethylene glycol bis (β-mercaptopropionate) and alkyl polythiols such as butane-1,4-dithiol, hexane-1,6-dithiol, and aromatic polythiols such as p-xylenedithiol and 1,3,5-tris (mercaptomethyl) benzene. Polythiols may be added in amounts of about 25 to about 50% based on the total weight of the composition, such as about 33 to about 40%.

Suitably the ratio of the epoxy compound to the polythiol compound in the composition is such that the ratio of epoxy equivalents to thiol equivalents is about 0.5:1 to about 1.5:1, such as about 0.75:1 to about 1.3:1.

The polythiol component described above may optionally be included in compositions of the second aspect of the invention. Polythiol compounds suitable for use in the invention are referred to in U.S. Pat. No. 5,430,112.

Discussion of the latent hardener component:

The epoxy resin compositions of the present invention include at least one latent hardener, which typically is heat activatable. Such a latent hardener should be substantially inactive at room temperature but be capable of activation at temperatures above 50° C. to effect the heat cure of the epoxy resin. Suitable hardeners are described in British Patent 1,121,196 (Ciba Geigy AG), European Patent Application 138465A (Ajinomoto Co.) or European Patent Application 193068A (Asahi Chemical), the disclosure of each of which are hereby expressly incorporated herein by reference. Other suitable hardeners for use herein include commercially available ones, such as Anchor Chemical 2014. British Patent 1,121,196 describes a reaction product of phthalic anhydride and an aliphatic polyamine, more particularly a reaction product of approximately equimolar proportions of phthalic acid and diethylamine triamine. A hardener of this type is available commercially from Ciba Geigy AG under the trade mark CIBA HT 9506.

Yet another type of latent hardener is a reaction product of (i) a polyfunctional epoxy compound, (ii) an imidazole compound such as 2-ethyl-4-methylimidazole and (iii) phthalic anhydride. The polyfunctional epoxy compound may be any compound having two or more epoxy groups in the molecule as described in U.S. Pat. No. 4,546,155, the disclosure of which is hereby expressly incorporated herein by reference. A hardener of this type is commercially available from Ajinomoto Co. Inc. under the trade mark AJICURE PN-23, is believed to be an adduct of EPON 828 (bisphenol type epoxy resin epoxy equivalent 184–194, commercially available from Shell Chemical Co.), 2-ethyl-4-methylimidazole and phthalic anhydride.

Other suitable hardeners are those given in U.S. Pat. No. 5,077,376, and those of the '112 patent termed "amine adduct latent accelerators", or the reaction product of a compound having one or more isocyanate groups in its molecule with a compound having at least one primary or secondary amino group in its molecule.

Additional latent hardeners include 2-heptadeoylimidazole, 2-phenyl-4,5-dihydroxymethylimidazole, 2-phenyl-4-methyl-5-hydroxymethylimidazole, 2-phenyl-4-benzyl-5-hydroxymethylimidazole, 2,4-diamino-8-2-methylimidazolyl-(1)-ethyl-5-triazine, additional products of triazine with isocyanuric acid, succinohydrazide, adipohydrazide, isophtholohydrazide, o-oxybenzohydrazide and salicylohydrazide.

Other commercially available latent hardeners from Ajinomoto include AMICURE MY-24, AMICURE GG-216 and AMICURE ATU CARBAMATE. In addition, NOVACURE HX-372, (commercially available from Asahi Kasei Kogyo, K.K., Japan) may also be used. See European Patent Application No. 459 614 discussed above.

The latent hardener may suitably be present in amounts of from about 5 to about 45 parts, desirably from about 1 to about 30 parts, more desirably from about 10 to about 20 parts by weight per 100 parts of the epoxy resin. The latent hardener may be prepared by industry recognised methods, or may be obtained commercially where available.

Discussion of the solid organic acid component

The solid organic acids useful in the epoxy resin compositions of the present invention may also include compounds which do not have one or more acid functional groups but which have an acidic proton or have an acid nature, for example enolisable materials.

The term 'aliphatic' as used herein refers to $C_1$–$C_{40}$ suitably $C_1$–$C_{30}$ straight or branched chain alkenyl, alkyl, or alkynyl which may or may not be interrupted or substituted by one or more heteroatoms such as O, N or S.

The term 'cycloaliphatic' as used herein refers to cyclised aliphatic $C_3$–$C_{30}$ suitably $C_3$–$C_{20}$ groups and includes those interrupted by one or more heteroatoms such as O, N, or S.

The term 'aromatic' refers to $C_3$–$C_{40}$ suitably $C_3$–$C_{30}$ aromatic groups including heterocyclic aromatic groups containing one or more of the heteroatoms, O, N, or S, and fused ring systems containing one or more of these aromatic groups fused together.

The term 'carboxylic acid' includes acids having one or more carboxylic groups, and if two or more are present, one or more may be optionally esterified, the ester group suitably comprising a $C_1$–$C_{10}$ alkyl group suitably a $C_1$–$C_4$ alkyl group.

The term 'quinone' includes compounds having one or more quinone groups and the terms aliphatic, cycloaliphatic and aromatic when used to describe quinones are used to refer to quinones to which aliphatic, cycloaliphatic and aromatic groups or combinations of these groups are attached by direct bonding or ring fusion.

The term 'phenol' includes compounds having one or more phenolic groups and the terms aliphatic, cycloaliphatic and aromatic when used to described phenols is used to refer to phenols to which aliphatic, cycloaliphatic and aromatic groups or combinations of these groups are attached by direct bonding or ring fusion.

The term 'enolisable' includes compounds having one or more emolisable functional groups.

The term 'derivatives' refers to substitutions at one or more positions (including directly on a heteroatom) with one or more of the following:

$C_1$–$C_{20}$ alkoxy, $C_1$–$C_{20}$ alkyl, $C_1$–$C_{20}$ alkenyl, a carbonyl group, a thiocarbonyl group such as —C=S group, a carboxylic group, a $C_1$–$C_4$ alkyl group further containing up to three N atoms, phenyl, $C_1$–$C_4$ alkylphenyl, or $C_1$–$C_4$ alkenylphenyl;

OR, NR, SR, SSR wherein R is phenyl, an aliphatic, cycloaliphatic or aromatic group, each of which may be optionally further substituted in any position with one or more, of $C_1$–$C_4$ alkyl, OH, halogen (F, Br, Cl, I), phenyl, a $C_1$–$C_4$ alkylphenyl, or $C_1$–$C_4$ alkenylphenyl or OR where R is phenyl, a carboxylic group, carbonyl, or an aromatic group and R is optionally substituted with $C_1$–$C_4$ alkyl, OH, or halogen; or nitro, nitrile, or halogen.

Examples of useful solid organic acids are phenols, quinones, carboxylic acids and enolisable materials. An example of an enolisable material is barbituric acid. The term "acid" includes polymeric acids including polycarboxylic acids and polyphenols.

The solid organic acids useful in the first aspect of the invention should be substantially insoluble in an epoxy resin/polythiol/latent hardener composition at temperatures in the range of about 5° C. to about 35° C., such as about 15° C. to about 30° C. For those of the second aspect of the invention the solid organic acid component should be substantially insoluble in a mixture of the epoxy component, latent hardener and thixotropic component at temperatures in the range of about 5° C. to about 35° C., such as about 15° C. to about 30° C.

The solid organic acid should be present in concentrations between about 0.1 to 25 parts by weight per 100 parts of the epoxy resin. The solid organic acid is present with respect to 100 parts by weight of the latent hardener (c) in an amount of from about 0.1 to about 80 parts by weight, preferably from about 0.5 to about 45 parts by weight, and more preferably from about 1 to about 5 parts by weight.

While in the first aspect of the invention the pKa of a solid organic acid should be less than that of the particular polythiol used in the composition, though the pKa of the solid organic acid chosen for the epoxy resin compositions of the first and second aspects of the invention should not be so low as to react with the epoxy compound. The solid organic acid should also have a degree of insolubility in the composition of the first aspect of the invention such that it can act as a reservoir permitting only sufficient acid to solubilise thereby neutralising any soluble hardener and/or a reaction product of the polythiol and the hardener. While not wishing to be limited to any theory it is thought that, in this way, the solid organic acid may act to prevent chemical reaction between the soluble hardener and the polythiol component on addition of the hardener to the composition and thus stabilise the composition over time. The solid organic acid which is substantially insoluble, remains so in effective amounts at temperatures below the elevated activation temperatures necessary to initiate cure of the composition. The temperatures below the activation temperature referred to include temperatures at or about room temperature. In other words, an amount of the solid organic acid remains in the solid form, the amount being effective to stabilise the composition. Thus cure initiating species present in the composition are neutralised by the solubilised acid, on a continuing basis. Of course, depending on the particular acid and hardener the stabilisation time may vary. Those skilled in the art will readily understand how to vary that time as desired by making appropriate choices of the particular components and using suitable amounts thereof.

The solid organic acids which are suitable for use in the composition of the first aspect of the invention should have a pKa less than the pKa of the polythiol component. Typical thiols have pKas within the range of about 8–12. Desirable acids are those having a pKa less than or equal to about 12.0, desirably less than or equal to about 10.0, and often less than or equal to about 9.0, such as less than or equal to about 7.5. Where a combination of two or more solid organic acids is used the pKa of the combination should be less than or equal to about 12.0. Ordinarily, at least one of the acids in the solid organic acid component has a pKa less than that of the polythiol, i.e. less than or equal to about 12.0, and suitably less than or equal to about 10.0 and often less than or equal to about 9.0 such as less than or equal to about 7.5. While polythiol is not necessarily a component of the compositions of the second aspect of the invention, it is desirable that acids having the pKa values described above are used in the second aspect also.

In the first aspect of the invention the solid organic acid may react preferentially with the soluble latent hardener until the acid concentration has been exhausted, at which time the latent hardener may react with the polythiol in epoxy/polythiol compositions of the invention to commence cure of the composition. In the second aspect of the invention the solid organic acid component remains substantially insoluble in the composition so that solid organic acid is present in an amount effective to stabilise the rheological properties of the composition. Some rheological stabilisation may be imparted by the neutralisation of the soluble latent hardener by the soluble acid. As described above for the first aspect the effective amount of the solid organic acid insoluble in the composition preferentially neutralises at least some cure initiating species in the composition, while retaining a sufficient reservoir of solid acid which can solubilise to replace the soluble acid consumed in neutralisation.

It is desirable that the acid has a mean particle size in the range about 0.1 to about 500 microns suitably about 5 to about 100 microns, and desirably about 10 to about 50 microns. Particle size has been found to influence the effect of the solid organic acid as discussed in more detail below.

The stabilisation effect is achieved in compositions of the first aspect of the invention without substantial loss of ability to cure (gel) at temperatures at 80–85° C. in a reasonable time.

The amount of chosen acid, will be influenced by its hydrogen equivalent, degree of solubility and particle size.

Certain combinations of acids (such as carboxylic acids and quinones) may show enhanced effects over acids used individually.

The solid organic acid may be selected from carboxylic acids of general formula I:

wherein:

$R_1$ is trans-CH=CHCO$_2$H, —CH=CHCO$_2$R[R is CH$_3$], —CH$_2$C(OR')(CO$_2$R")CH$_2$CO$_2$R'", [R' is H, C$_1$–C$_{10}$alkyl, Ar], [R" is H, C$_1$–C$_{10}$alkyl, Ar], [R'" is H, C$_1$–C$_{10}$alkyl, Ar], C$_{11}$–C$_{18}$ alkyl, —(CH$_2$)$_n$CO$_2$H[n is 1–9], —(CHR)$_n$CO$_2$H [R is H, OH, n is 1 or 2], —CH(OR')R"[R' is H, alkyl, R"=C$_1$–C$_{10}$alkyl, Ph], —CH=CH—Ar, or

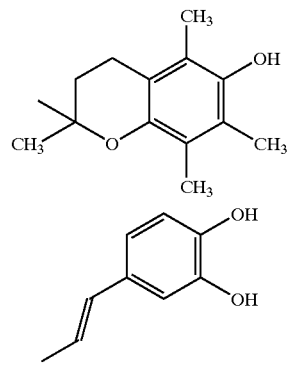

Other suitable compounds are benzoic acids of general Formula II:

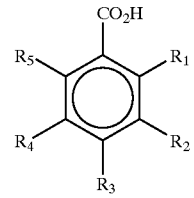

wherein:

$R_1$ is H, alkyl, haloalkyl such as CX$_3$[X is F, Cl, Br, I], alkenyl, OR[R is alkyl, Ph, Bn, Ar], —S—S—Ar—CO$_2$H,—S—S—Ar, —SR[R is H, alkyl, haloalkyl, Ph, Bn, Ar], Ph, Bn, Ar, CO$_2$R[R is H, alkyl, Ph, Bn, Ar], CO.R[R is H, alkyl, Ph, Bn, Ar], NO$_2$, $R_2$ is H, alkyl, haloalkyl such as CX$_3$ [X is F, Cl, Br, I], alkenyl, Ph, Bn, Ar, OR,[R is alkyl, Ph. Bn, Ar],—CH$_2$Ar. NO$_2$, CO.R[R is C$_1$–C$_{10}$alkyl, Ph, Bn, Ar], CHO, CO$_2$R[R is H, alkyl, haloalkyl, Ph, Bn, Ar], or

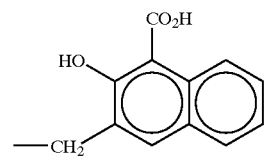

$R_3$ is H, alkyl, haloalkyl such as CX$_3$ [X is F, Cl, Br, I], alkenyl, OH, OR[R is alkyl, Ph, Bn, Ar] Ph, Bn, Ar, alkyl, CHO, CO.R[R is alkyl, Ph, Bn, Ar], CO$_2$R[R is H, alkyl, Ph, Bn, Ar]NO$_2$;

$R_4$ is H, alkyl, haloalkyl such as $CX_3$[X is F, Cl, Br, I], alkenyl, OR[R is alkyl, Ph, Bn, Ar], $NO_2$, CO.R[R is alkyl, Ph, Bn, Ar] CHO, $CO_2R$[R is H, alkyl, Ph, Bn, Ar], Ph, Bn, Ar;

$R_5$ is H, alkyl, haloalkyl such as $CX_3$[X is F, Cl, Br, I], alkenyl, OH, OR[R is alkyl, Ph, Bn, Ar], Ph, Bn, Ar, CHO, CO.R[R is alkyl, Ph, Bn, Ar], $CO_2R$[R is H, alkyl, Ph, Bn, Ar],$NO_2$.

Quinones of general Formula III are also suitable for use in the composition of the present invention:

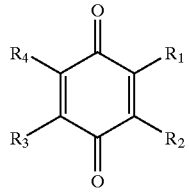

wherein:

$R_1$, $R_2$, $R_3$ and $R_4$ are independently H, alkyl, haloalkyl, alkenyl, OR[R is H, alkyl, Ar, Ph, Bn] CN, Ph, Ar.

Phenols of general Formula IV:

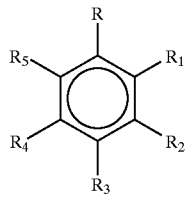

wherein:

R is H, OH;

$R_1$ is H, alkyl, haloalkyl such as $CX_3$[X is F, Br, Cl, I],alkenyl, Cl, F, Br, I, CN, OH, OR[R is alkyl, Ph, Bn, Ar], $NO_2$, CO.R. [R is alkyl, Ph, Bn, Ar],CHO, $CO_2R$[R is H, alkyl, Ph, Bn, Ar], PhOH.

$R_2$ is H, alkyl, haloalkyl, alkenyl, OH, OR[R is alkyl, Ph, Bn, Ar],Ph, Bn,—$CH_2Ar$, CN, F, Cl, Br, I, $R_3$ is H, alkyl, haloalkyl such as $CX_3$[X is F, Br, Cl, I], alkenyl, $NO_2$, CO.R[R is alkyl, Ph, Bn, Ar], CHO, $CO_2R$[R is alkyl, Ph, Bn, Ar], OH, OR[R is alkyl, Ph, Bn, Ar], Ar, Bn, Ph, $C(R)_2PhOH$[R is Me or H], $C(R)_2Ar$[R is Me or H] or:

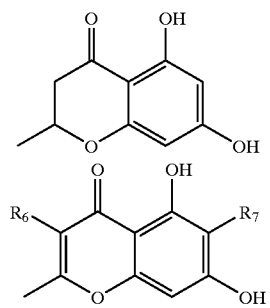

wherein:

$R_6$ and $R_7$ are independently H, alkyl, haloalkyl, alkenyl, OH, OR [R is alkyl, Ph, Bn, Ar];

$R_4$ is H, alkyl, haloalkyl, alkenyl, OH, OR[R is alkyl, Ph, Bn, Ar], F, Cl, Br, I, CN, Ph, Bn,—$CH_2Ar$;

$R_5$ is H, alkyl, haloalkyl such as $CX_3$[X is F, Br, Cl, I],alkenyl, F, Cl, Br ,I, CN, OH, OR[R is alkyl, Ph ,Bn, Ar], $NO_2$, CO.R [R is alkyl, Ph, Bn, Ar], CHO, $CO_2R$[R is H, alkyl, Ph, Bn, Ar], PhOH, provided that a compound of general Formula IV is chosen to have at least one phenolic group present.

Enolisable materials such as those compounds of general Formula V

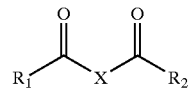

wherein:

$R_1$ or $R_2$ are NR'CO.NR"R'" [R' is H, alkyl, Ph, Ar, R" is H, alkyl, Ph, Ar, R'" is H, alkyl, Ph, Ar], OR[R is H, alkyl, Ph, Ar]

X is $(CH_2)_n$, $C(R)_2$[R is alkyl, Ph, Ar, CN], O, S, NR[R is H, alkyl, Ph, Ar], n is 0–10, may also be used.

The enolisable material may be selected from compounds of general Formula VI:

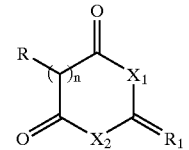

wherein (a) $X_1=X_2=NH$, R=H, $R_1=O$, n=1; or (b) $X_1=X_2=NH$, $R_1=O$, n is zero so that the cyclic structure has a five membered ring; or (c) $X_1=X_2=O$, R=H, $R_1=(CH_3)_2$, n=1; or (d) $X_1=X_2=O$, R=Ph, $R_1=(CH_3)_2$, n=1; are also suitable for use in the present invention.

In Formulae I to VI above, Ar represents substituted phenyl, substituted or unsubstituted bicyclic or multicyclic aromatic compounds, e.g. naphthalene, substituted naphthalene, and the like and Ph is phenyl. Bn is a substituted or unsubstituted benzyl group. Alkyl may be straight chained or branched $C_1$–$C_{20}$ alkyl, suitably $C_1$–$C_{10}$ alkyl. Haloalkyl should be interpreted as an alkyl substituted one or more times by one or more halogens. Alkenyl may be straight chain or branched $C_2$–$C_{20}$ alkenyl, suitably $C_2$–$C_{10}$ alkenyl. Groups where alkyl most often represents $C_1$–$C_5$ alkyl include the OR group—such as in Formula III, and in the definition of R' in the group— CH(OR')R" in Formula I. The term 'substituted' includes substitution by the derivatives listed above.

The solid organic acid may for example be selected from: 4-nitroguaiacol, 3,4,5-trimethoxy benzoic acid, hexachlorophene, 4,5,7-trihydroxyflavanone, phloroglucinol, fumaric acid, 3,4-dihydroxy benzoic acid, 3,4,5-trihydroxy benzoic acid, trolox, pamoic acid, ascorbic acid, citric acid, 3,4-dihydroxy cinnamic acid, 2,3-dicyanohydroquinone, barbituric acid, tetrahydroxy-p-benzoquinone, parabanic acid, phenyl boronic acid, 5-phenyl Meldrum's acid and Meldrum's acid.

Of these acids those which display a greater stabilising effect are barbituric acid, Trolox, and fumaric acid with barbituric acid displaying a better stabilising effect. A number of solid organic acids which are useful in the present invention are set out below, and for ease of discussion herein only, have been classified into four different groups.

EXAMPLES OF SOLID ORGANIC ACIDS

| Phenolic Functional Groups | Carboxylic Functional Groups |
|---|---|
| 4-nitroguaiacol<br>hexachlorophene<br>4,5,7-trihydroxyflavanone<br>phloroglucinol | 3,4,5-trimethoxy benzoic acid<br>fumaric acid<br>3,4-dihydroxy benzoic acid<br>3,4-trihydroxy benzoic acid<br>Trolox (6-hydroxy-2,5,7,8-tetramethylchroman-2 carboxylic acid)<br>pamoic acid<br>ascorbic acid<br>citric acid<br>3,4-dihydroxy cinnamic acid |
| Quinone Derivatives | Enolisable Acids |
| 2,3-dicyanohydroquinone<br>tetrahydroxy-p-benzoquinone | babarituric acid<br>parabanic acid<br>phenyl boronic acid<br>5-phenyl Meldrum's acid<br>Meldrum's acid |

Discussion of thixotropy-conferring component:

The thixotropy-conferring component which is an optional component '(e)' of the composition of the first aspect of the invention, and which is component '(iii)' of the compositions of the second aspect of the invention, may often include reinforcing silicas, such as fused or fumed silicas, and may be untreated or treated so as to alter the chemical nature of their surface. Virtually any reinforcing fused or fumed silica may be used.

Examples of such treated fumed silicas include polydimethylsiloxane-treated silicas and hexamethyldisilazane-treated silicas. Such treated silicas are commercially available, such as from Cabot Corporation under the tradename CAB-O-SIL ND-TS and Degussa Corporation under the tradename AEROSIL, such as AEROSIL R805.

Of the untreated silicas, amorphous and hydrous silicas may be used. For instance, commercially available amorphous silicas include AEROSIL 300 with an average particle size of the primary particles of about 7 nm, AEROSIL 200 with an average particle size of the primary particles of about 12 nm, AEROSIL 130 with an average size of the primary particles of about 16 nm; and commercially available hydrous silicas include NIPSIL E150 with an average particle size of 4.5 nm, NIPSIL E200A with and average particle size of 2.0 nm, and NIPSIL E220A with an average particle size of 1.0 nm (manufactured by Japan Silica Kogya Inc.).

Desirable ones also have a low ion concentration and are relatively small in particle size (e.g., on the order of about 2 microns), such as the silica commercially available from Admatechs, Japan under the trade designation SO-E5. Other desirable materials for use as the thixotropy-conferring component include those constructed of, or containing aluminum oxide, silicon nitride, aluminum nitride and silica-coated aluminum nitride.

The thixotropy-conferring agent should be used in an amount within the range of 5 to 40 parts, such as about 15–25 parts, per hundred parts of the epoxy component depending on the rheology requirements of the end use application.

The particular set of rheological properties developed for an adhesive may tend to change over time. These properties impact the shelf-life stability of the adhesive composition, and can affect the dispensability of the adhesive in its end-use applications. Many commercially available adhesives, including currently-available epoxy-based adhesives, are inherently chemically unstable and, even under manufacturer-recommended refrigerated storage conditions, can suffer from unstable rheological properties (such as yield point decreases over time). The extent of this instability often depends upon temperature. Such yield point instability can affect the dispensability of the composition over time and can result in weaker bond strengths due to changes in the dot profile.

More specifically, in the context of curable one-part epoxy resins, viscosity increases are often seen over time, with the viscosity increase often being drastic in a relatively short time period. In such case, the pot life may be considered too short for wide-range commercial applicability. Such viscosity increases are due at least in part to the onset of polymerization initiation.

Yield point decreases may also be observed to occur over time in such compositions. Such yield point decreases are particularly prevalent in those compositions whose structure has been increased through the addition of thickeners or thixotropy-conferring components.

As noted, these changes in rheological properties over time adversely impact the shelf-life stability of the adhesive composition. The epoxy resin compositions of the invention which comprise this thixotropy-conferring agent typically have yield points in the range of about 30–700 Pa, suitably 150–450 Pa, and a viscosity measured at a temperature of about 25° C. in the range of about 1–50 Pa.s, suitably 1 to 25 Pa.s desirably 1–10 Pa.s. The yield point and the viscosity are maintained substantially within these respective ranges over time.

Other Additives:

Any number of conventional additives may also be added to the epoxy resin compositions of the present invention including fillers, thixotropic imparting agents (if not already present), reactive diluents, non-reactive diluents, pigments, flexibilisers, and the like, depending on the intended end use of the composition.

End-use applications of compositions of the invention:

The epoxy resin compositions of the present invention are appropriate for use in any conventional application of epoxy compositions, such as adhesive or coating agents. They may be used in the electronics industry generally, including the microelectronic industry. One commercial use of epoxy resins is to bond a surface mount semiconductor device to a pcb in a chip bonding application. A method of using a composition of the invention to achieve such a result typically includes the steps of: (i) dispensing onto an appropriate location on a carrier substrate a sufficient amount of the composition, (ii) positioning over the location bearing the composition an electronic component, (iii) mating the electronic component with the carrier substrate, and (iv) exposing the mated electronic component/carrier substrate assembly to conditions favourable to effect cure of the composition.

Another commercial use is as an underfill sealant to seal the space between a semiconductor, device electrically connected to a circuit board. The epoxy resin compositions of the invention are suitable for this purpose.

A method of underfilling a space between an electronic component and a carrier substrate the electronic component being mounted on the carrier substrate typically includes the step of dispensing an amount of an epoxy resin composition according to the present invention into the space between the electronic component and the carrier substrate, and exposing the epoxy resin compositions to condition which effect cure is also provided.

In use, the epoxy resin compositions of the present invention may be applied to a substrate in any conventional fashion. Suitable application modes include syringe dispensing, pin-transfer, screen printing, and through other conventional adhesive dispensing equipment.

In a chip bonding application and with reference to FIG. 1 (schematic diagrams A and B showing a substrate with a dot of adhesive composition applied thereto), a high yield point produces a conical dot, which retains its shape with time (Dot A.). Shape retention occurs because the yield point is sufficiently large to resist the force of gravity with respect to an application use time scale. A yield point which is too low results in a dot that spreads out over time yielding a low, rounded appearance. (Dot B.) If the dot spreads too much in that period it can cover the solder lands and prevent good contact of a semiconductor chip to the pcb.

Figure 2:
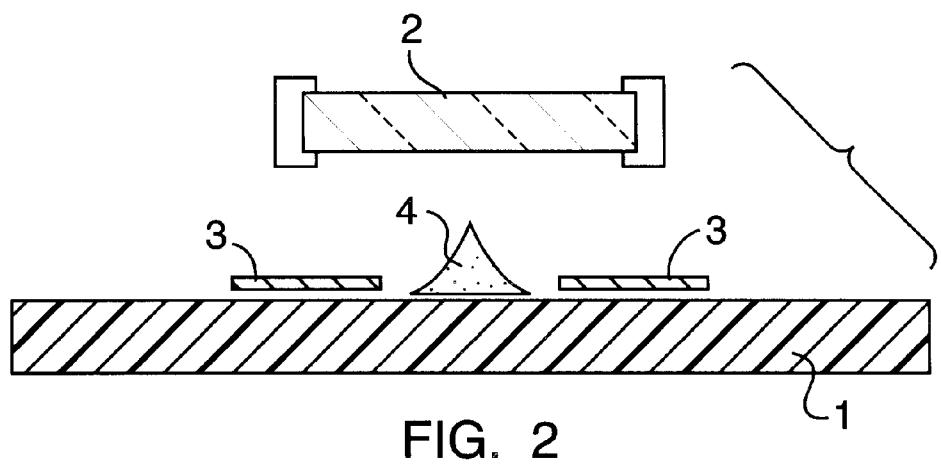
FIG. 2 is a schematic diagram depicting in an exploded view epoxy resin compositions of the present invention in use to bond a semiconductor chip to a pcb.

Reference to FIG. 2 shows a mounted structure on which an epoxy resin composition 4 according to a second aspect of the invention, has been dispensed onto a carrier substrate 1 (e.g., a pcb) between the solder lands 3. The semiconductor chip 2 is positioned over the location of the carrier substrate 1 onto which the epoxy resin composition 4 has been dispensed, and the carrier substrate and semiconductor substrate are thereafter mated. FIG. 2 shows the epoxy resin composition 4 having been dispensed onto the carrier substrate 1. In certain instances it may be desirable to apply the composition onto the semiconductor chip 2 instead, or apply the composition onto both the carrier substrate 1 and the semiconductor chip 2.

The epoxy resin composition is then exposed to conditions appropriate to effect cure so as to bond together the carrier substrate and the semiconductor chip. Ordinarily, those conditions include a heat cure mechanism.

In order to improve reliability, the space between the semiconductor chip 2 and the carrier substrate 1 may be suitably sealed with an underfill sealant 10 which may be an epoxy resin composition of the present invention. The epoxy resin compositions of the present invention may be used in conjunction with, or instead of, conventional underfill sealants such as any of those commercially available from Loctite Corporation, including Loctite product number 3150. (See FIG. 3. and the description below). The cured product of the underfill sealant should completely fill that space.

Figure 3:
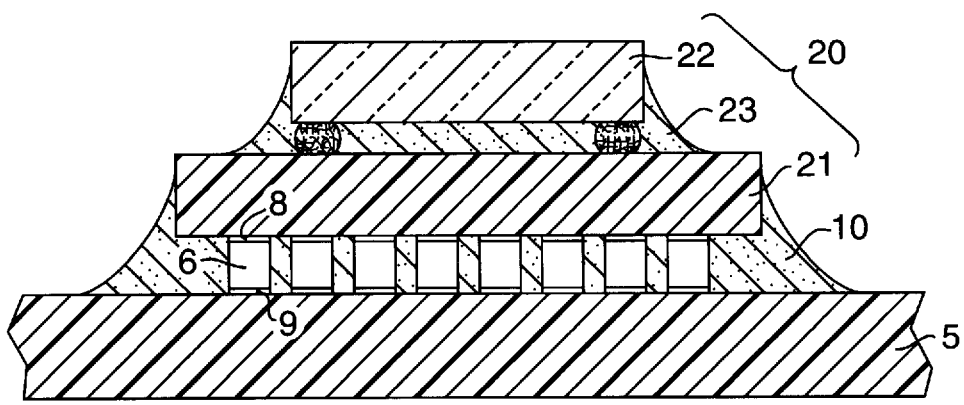
FIG. 3 is a schematic diagram depicting compositions in accordance with this invention in use to bond a semiconductor chip to a pcb, between which has been dispensed an underfill sealant.

Carrier substrates may be constructed from ceramic substrates of $Al_2O_3$, $SiN_3$ and mullite ($Al_2O_3$-$SiO_2$); substrates or tapes of heat-resistant resins, such as polyimides; glass-reinforced epoxy; ABS and phenolic substrates which are also used commonly as circuit boards; and the like. In FIGS. 2 and 3, the solder lands are depicted as the electrical connection means.

In the arrangement of FIG. 3 the semiconductor device 20 is one formed by connecting a semiconductor chip (so-called bare chip) 22, such as LSI, to a carrier substrate 21 using an epoxy resin composition at the invention and sealing the space therebetween suitably with resin 23. This semiconductor device is mounted at a predetermined position of the circuit board 5, and electrodes 8 and 9 are electrically connected by a suitable connection means such as solder. In order to improve reliability. the space between carrier substrate 21 and circuit board 5 is sealed with an underfill sealant which is the cured product 10 of a thermosetting resin composition. The cured product 10 of the thermosetting resin composition need not completely fill the space between carrier substrate 1 and circuit board 5, but may fill it to such an extent as to relieve stresses caused by thermal cycles.

Cured reaction products of the epoxy resin compositions of the present invention should demonstrate excellent adhesive force, heat resistance and electric properties, and acceptable mechanical properties, such as chemical resistance, moisture resistance and the like, for the applications for which they are used herein.

While the present invention has been explained above in detail, the following examples illustrate further the benefits and advantages achieved by the inventive compositions.

EXAMPLES

The materials used in the following non-limiting examples are referred to as follows:

Epoxy Resins

"EP-828"-Epikote 828 (trade name of Shell Chemical Co.)

"EPON 862" is a bisphenol F epoxy resin (trade name of Shell Chemical Co.)

"RE-310S"-(trade name of Nippon Kayaku)

DEN 438 is an epoxy novolac resin, available from Dow Chemical Company.

Polythiol Compounds

"TMPT"-Trimethylolpropane tris (β-mercaptopropionate) (product of Aldrich Chemical Co.)

"PETMP"-Pentaerythritol tetrakis (β-mercaptopropionate) (product of Evans Chemetics)

Latent Hardeners

"PN-23"-AJICURE PN-23 (trade name, product of Ajinomoto Co., Inc)

"PN-H"-AJICURE PN-H (trade name, product of Ajinomoto Co., Inc)

Solid Organic Acids

Trolox-Trolox is 97% pure 6-hydroxy-2,5,7,8-tetramethylchroman-2 carboxylic acid. (Trolox is a trade mark and product of Aldrich Chemical Co.).

I. Preparation of Low Temperatures Curing Epoxy-Based Compositions

We prepared a control composition of an epoxy resin, a polythiol and a latent hardener. The gel time at 85° C. and room temperature (and in some cases at 40° C.) and stability was recorded. The corresponding compositions containing a solid organic acid of the invention were then prepared. Because the solid organic acid is substantially insoluble in the epoxy/polythiol mixture it was evenly dispersed prior to the addition of the hardener.

As stated above, in the following Examples where a solid organic acid is added we added it to the epoxy-polythiol mixture prior to addition of the latent hardener. We prepared the following compositions:

Example 1

Control for Examples 2 to 4

1) To a mixture prepared by blending 100 parts by weight Epikote 828 and 75 parts by weight trimethylolpropane tris (β-mercaptopropionate) we added 4 parts by weight AJI-CURE PN-H. The components were mixed thoroughly and degassed to obtain control epoxy resin composition 1 (Table 1a). Composition 1 (Table 1b) was observed to have a gel time of 70 seconds at 85° C. and a RT stability of 30 days. The stability of the composition at 40° C. was 4 days.

Examples 2 to 4

2) Epoxy resin composition 2 was prepared in the same manner as composition 1 (Table 1a) with the addition of 0.5 parts by weight of fumaric acid. Composition 2 (Table 1b) was observed to have a gel time of 90 seconds at 85° C. and a RT stability of greater than 58 days. The stability of the composition at 40° C. was 11–14 days.

3) Composition 3 (Table 1a) was prepared as in example 1 with the addition of 0.5 parts by weight barbituric acid. Composition 3 (Table 1b) was observed to have a gel time of 160 seconds and a RT stability of greater than 58 days. The stability of the composition at 40° C. was greater than 42 days.

4) Composition 4 (Table 1a) was prepared as in example 1 but with the addition of 0.5 parts by weight 3,4-dihydroxy cinnamic acid (Table 1b) was observed to have a gel time of 135–160 seconds and a RT stability of greater than 42 days. The stability of the composition at 40° C. was 18–21 days.

Example 5

Control for Examples 6 to 11

5) Epoxy resin composition 5 was prepared by mixing 100 parts by weight Epikote 828 with 75 parts by weight trimethylolpropane tris (β-mercaptopropionate) and to this adding 25 parts by weight of AJICURE PN-23. The components were mixed thoroughly and degassed to obtain epoxy resin control composition 5 (Table 1a). Composition 5 (Table 1b) was observed to have a gel time of 12 seconds at 85° C. and a RT stability of 3–16 hours. The stability of the composition at 40° C. was less than 16 hours.

Examples 6 to 11

6) Epoxy resin composition 6 (Table 1a) was prepared as in example 5 above with the addition of 12 parts by weight of fumaric acid. Composition 6 (Table 1b) was observed to have a gel time of 50 seconds at 85° C. and a RT stability of greater than 30 days. The stability of the composition at 40° C. was greater than 15 days.

7) Composition 7 (Table 1a) was prepared as in example 5 with the addition of 12 parts by weight of barbituric acid. Composition 7 (Table 1b) was observed to have a gel time of 150 seconds at 85° C. and a RT stability of greater than 30 days. The stability of the composition at 40° C. was greater than 12 days.

8) Composition 8 (Table 1a) was prepared as in example 5 with the addition of 8 parts by weight of salicylic acid. Composition 8 (Table 1b) was observed to have a gel time of greater than 300 seconds at 85° C. and a RT stability of 4–5 days. The stability of the composition at 40° C. was less than 24 hours.

9) Composition 9 (Table 1a) was prepared as in example 5 with the addition of 8 parts by weight of phenyl boronic acid. Composition 6 (Table 1b) was observed to have a gel time of 120 seconds at 85° C. and a RT stability of 4–5 days. The stability of the composition at 40° C. was less than 24 hours.

10) Composition 10 (Table 1a) was prepared as in example 5 with the addition of 8 parts by weight of 5-phenyl Meldrum's acid. Composition 10 (Table 1b) was observed to have a gel time of greater than 300 seconds at 85° C. and a RT stability of greater than 9 days.

11) Composition 11 (Table 1a) was prepared as in example 5 with the addition of 8 parts by weight of pamoic acid. Composition 11 (Table 1b) was observed to have a gel time of 25 seconds at 85° C. and a RT stability of 6–7 days.

Example 12

Control for Examples 13 and 14

12) Epoxy resin composition 12 was prepared by mixing 100 parts by weight Epikote 828 with 75 parts by weight trimethylolpropane tris (β-mercaptopropionate) and adding to this 2 parts by weight of AJICURE PN-23. The components were mixed thoroughly and degassed to obtain epoxy resin control composition 12 (Table 2a). Composition 12 (Table 2b) was observed to have a gel time of 90 seconds at 85° C. and a RT stability of 2–3 days. The stability of the composition at 40° C. was less than 24 hours.

Examples 13 and 14

13) Composition 13 (Table 2a) was prepared as in example 12 with the addition of 1 part by weight of phloroglucinol. Composition 13 (Table 2b) was observed to have a gel time of 300 seconds at 85° C. and a RT stability of 15 days.

14) Composition 14 (Table 2a) was prepared as in example 12 with the addition of 1 part by weight of tartaric acid. Composition 14 (Table 2b) was observed to have a gel time of 200 seconds at 85° C. and a RT stability of 10–13 days.

Example 15

Control for Examples 16 to 18

15) Epoxy resin composition 15 was prepared by mixing 100 parts by weight Epikote 828 with 33 parts by weight of pentaerythritol tetrakis (β-mercaptopropionate) and adding to this mixture 20 parts by weight of AJICURE PN-23. The components were mixed thoroughly and degassed to obtain epoxy resin control composition 15 (Table 2a). Composition 15 (Table 2b) was observed to have a gel time of 15 seconds at 85° C. and a RT stability of less than 16 hours. The stability of the composition at 40° C. was less than 16 hours.

Examples 16 to 18

16) Epoxy resin compositions 16 (Table 2a) was prepared as in example 15 above with the addition of 8 parts by weight of fumaric acid. Composition 16 (Table 2b) was observed to have a gel time of 60 seconds at 85° C. and a RT stability of 30 days. The stability of the composition at 40° C. was 9 days.

17) Epoxy resin composition 17 was prepared by mixing 100 parts by weight Epikote 828 with 33 parts by weight of pentaerythritol tetrakis (β-mercaptopropionate) and adding to this mixture 12 parts by weight of AJICURE PN-H. The components were mixed thoroughly and degassed to obtain epoxy resin control composition 17 (Table 2a). Composition 17 (Table 2b) was observed to have a gel time of 35 seconds at 85° C. and a RT stability of 4–7 days. The stability of the composition at 40° C. was 2–4 days.

18) Epoxy resin composition 18 (Table 2a) was prepared as in example 17 above with the addition of 4.64 parts by weight of fumaric acid. Composition 18 (Table 2b) was observed to have a gel time of 60 seconds at 85° C. and a room temperature stability of greater than 30 days. The stability of the composition at 40° C. was 7 days.

Example 19 Comparative

19) Composition 19 (Table 2a) was prepared by mixing 100 parts by weight of Epikote 828 with 50 parts by weight of pentaerythritol tetrakis (β-mercaptopropionate) and 20 parts by weight AJICURE PN-23, and with addition of 4.0 parts by weight of barbituric acid. Composition 19 (Table 2b) was observed to have a gel time of 90 seconds at 85° C. and a RT stability of greater than 17 days. The stability of the composition at 40° C. was greater than 17 days.

Example 20

Control for Example 21

20) Epoxy resin composition 20 was prepared by mixing 100 parts by weight Epikote 828 with 50 parts by weight of pentaerythritol tetrakis (β-mercaptopropionate) and adding to this mixture 8 parts by weight of AJICURE PN-H. The components were mixed thoroughly and degassed to obtain epoxy resin control composition 20 (Table 2a). Composition 20 (Table 2b) was observed to have a gel time of 30 seconds at 85° C. and a RT stability of 8 days. The stability of the composition at 40° C. was 2–4 days.

Example 21

21) Composition 21 (Table 2a) was prepared as in example 20 above but with the addition of 3.62 parts by weight of barbituric acid. Composition 21 (Table 2b) was observed to have a gel time of 70 seconds at 85° C. and a RT stability of greater than 30 days. The stability of the composition at 40° C. was 8 days.

Example 22

Control for Example 23

22) Epoxy resin composition 22 was prepared by mixing 100 parts by weight Epikote 828 with 50 parts by weight of pentaerythritol tetrakis (β-mercaptopropionate) and adding to this mixture 30 parts by weight of AJICURE PN-H. The components were mixed thoroughly and degassed to obtain epoxy control resin composition 22 (Table 2a). Composition 22 (Table 2b) had a gel time of 20 seconds at 85° C. and a RT stability of 3–4 days. The stability of the composition at 40° C. was less than 16 hours.

Example 23

23) Composition 23 (Table 2a) was prepared as in example 22 above but with addition 8 parts by weight of 3,4-dihydroxycinnamic acid. Composition 23 (Table 2b) was observed to have a gel time of 120 seconds at 85° C. and a RT stability of 11 days. The stability of the composition at 40° C. was 6 days.

Example 24

Control for Example 25

24) Epoxy resin composition 24 (Table 2a) was prepared by mixing 100 parts by weight Epikote 828 with 50 parts by weight of trimethylolpropane tris (β-mercaptopropionate) and adding to this mixture 20 parts by weight of AJICURE PN-23. The components were mixed thoroughly and degassed to obtain epoxy resin control composition 24. Composition 24 (Table 2b) had a gel time of 25 seconds at 85° C. and a RT stability of 3–16 hours. The stability of the composition at 40° C. was less than 16 hours.

Example 25

25) Composition 25 (Table 2a) was prepared as in example 24 above but with the addition of 8 parts by weight of Trolox. Composition 25 (Table 2b) was observed to have a gel time of 120 seconds at 85° C. and a RT stability of 21 days. The stability of the composition at 40° C. was 3–4 days.

Example 26

Control for Examples 27 to 40

26) Epoxy resin composition 26 (Table 3a) was prepared by mixing 100 parts by weight Epikote 828 with 50 parts by weight of pentaerythritol tetrakis (β-mercaptopropionate) and adding to this mixture 20 parts by weight of AJICURE PN-23. The components were mixed thoroughly and degassed to obtain epoxy resin control composition 26. Composition 26 (Table 3b) was observed to have a gel time of 20 seconds at 85° C. and a RT stability of 3–16 hours.

Examples 27 to 40

27) Composition 27 (Table 3a) was prepared as in example 26 above but with the addition of 8 parts by weight of 3,4,5-trimethoxy benzoic acid. Composition 27 (Table 3b) was observed to have a gel time of 200 seconds at 85° C. and a RT stability of 25 days.

28) Composition 28 (Table 3a) was prepared as in example 26 above but with the addition of 8 parts by weight of fumaric acid. Composition 28 (Table 3b) was observed to have a gel time of 120 seconds at 85° C. and a RT stability of 48 days.

29) Composition 29 (Table 3a) was prepared as in example 26 above but with the addition of 8 parts by weight of 2,3-dicyanohydroquinone. Composition 29 (Table 3b) was observed to have a gel time of 150 seconds at 85° C. and a RT stability of 11 days.

30) Composition 30 (Table 3a) was prepared as in example 26 above but with the addition of 8 parts by weight of hexachlorophene. Composition 30 (Table 3b) was observed to have a gel time of 30 seconds at 85° C. and a RT stability of 9 days.

31) Composition 31 (Table 3a) was prepared as in example 26 above but with the addition of 8 parts by weight of 2,2'-dithiosalicyclic acid. Composition 31 (Table 3b) was observed to have a gel time of 25–30 seconds at 85° C. and a RT stability of 11 days.

32) Composition 32 (Table 3a) was prepared as in example 26 above but with the addition of 8 parts by weight of 3,4-dihydroxycinnamic acid. Composition 32 (Table 3b) was observed to have a gel time of 20 at 85° C. and a RT Stability of 11 days.

33) Composition 33 (Table 3a) was prepared as in example 26 above but with the addition of 8 parts by weight of 3,4-dihydroxy benzoic acid. Composition 33 (Table 3b) was observed to have a gel time of 60–90 seconds at 85° C. and a RT stability of 13 days.

34) Composition 34 (Table 3a) was prepared as in example 26 above but with the addition of 8 parts by weight of 4,5,7-trihydroxyflavanone. Composition 34 (Table 3b) was observed to have a gel time of 35 seconds at 85° C. and a RT stability of 1.5 days.

35) Composition 35 (Table 3a) was prepared as in example 26 above but with the addition of 8 parts by weight of 3,5,-dinitrosalicyclic acid. Composition 35 (Table 3b) was observed to have a gel time of 60–90 seconds at 85° C. and a RT stability of 4 days.

36) Composition 36 (Table 3a) was prepared as in example 26 above but with the addition of 8 parts by weight of 3,4,5,-trihydroxy benzoic acid. Composition 36 (Table 3b) was observed to have a gel time of 120 seconds at 85° C. and a RT stability of greater than 12 days.

37) Composition 37 (Table 3a) was prepared as in example 26 above but with the addition of 8 parts by weight of barbituric acid. Composition 37 (Table 3b) was observed to have a gel time of 90 seconds at 85° C. and a RT stability of greater than 12 days.

38) Composition 38 (Table 3a) was prepared as in example 26 above but with the addition of 8 parts by weight of parabanic acid. Composition 38 (Table 3b) was observed to have a gel time of 90 seconds at 85° C. and a RT stability of greater than 12 days.

39) Composition 39 (Table 3a) was prepared as in example 26 above but with the addition of 8 parts by weight of tetrahydroxy-p-benzoquinone. Composition 39 (Table 3b) was observed to have a gel time of 60 seconds at 85° C. and a RT stability of greater than 19 days.

40) Composition 40 (Table 3a) was prepared as in example 26 above but with the addition of 8 parts by weight of 4-nitroguaiacol Composition 40 (Table 3b) was observed to have a gel time of 60–80 seconds at 85° C. and a RT stability of 6–7 days.

Example 41

Control for Example 42

41) Epoxy resin composition 41 (Table 4a) was prepared by mixing 100 parts by weight of epoxy resin RE-310S with 50 parts by weight of pentaerythritol tetrakis (β-mercaptopropionate) and adding to the mixture 5 parts by weight of AJICURE PN-23. The components were mixed thoroughly and degassed to obtain epoxy resin control composition 41. Composition 41 (Table 4b) was observed to have a gel time of 37 seconds at 85° C. and a RT stability of less than 24 hours. The stability of the composition at 40° C. was less than 24 hours.

Example 42

42) Composition 42 (Table 4a) was prepared as in example 41 above but with the addition of 2 parts by weight of barbituric acid. Composition 42 (Table 4b) was observed to have a gel time of 80 seconds at 85° C. and a RT stability of greater than 35 days. The stability of the composition at 40° C. was 25 days.

Example 43

Control for Example 44

43) Epoxy resin composition 43 was prepared by mixing 100 parts by weight of epoxy resin RE-310S with 50 parts by weight of pentaerythritol tetrakis (β-mercaptopropionate) and adding to the mixture 5 parts by weight of AJICURE PN-H. The components were mixed thoroughly and degassed to obtain epoxy resin control composition 43. Composition 43 (Table 4b) was observed to have a gel time of 55 seconds at 85° C. and a RT stability of 4 days. The stability of the composition at 40° C. was less than 24 hours.

Example 44

44) Composition 44 (Table 4a) was prepared as in example 43 above but with the addition of 2 parts by weight of barbituric acid. Composition 44 (Table 4b) was observed to have a gel time of 105 seconds at 85° C. and a RT stability of greater than 35 days. The stability of the composition at 40° C. was 25 days.

Example 45

Control for Examples 46 and 47

45) Epoxy resin composition 45 (Table 4a) was prepared by mixing 100 parts by weight of epoxy resin RE-310S with 50 parts by weight of trimethylolpropane tris (β-mercaptopropionate) and adding to the mixture 20 parts by weight of AJICURE PN-H. The components were mixed thoroughly and degassed to obtain epoxy resin control composition 45. Composition 45 (Table 4b) was observed to have a gel time of 42 seconds at 85° C. and a RT stability of 5 days. The stability of the composition at 40° C. was 2 days.

Examples 46 and 47

46) Composition 46 (Table 4a) was prepared as in example 45 above but with the addition of 8 parts by weight of fumaric acid. Composition 46 (Table 4b) was observed to have a gel time of 54 seconds at 85° C. and a RT stability of greater than 30 days. The stability of the composition at 40° C. was 5 days.

47) Composition 47 (Table 4a) was prepared as in example 45 above but with the addition of 8 parts by weight of barbituric acid. Composition 47 (Table 4b) was observed to have a gel time of 150 seconds at 85° C. and a RT stability of greater than 30 days. The stability of the composition at 40° C. was 6 days.

Example 48

Control for Example 49

48) Epoxy resin composition 48 (Table 4a) was prepared by mixing 100 parts by weight of epoxy resin RE-310S with 50 parts by weight of trimethylolpropane tris (β-mercaptopropionate) and adding to this mixture 5 parts by weight of AJICURE PN-23. The components were mixed thoroughly and degassed to obtain epoxy resin control composition 48. Composition 48 (Table 4b) was observed to have a gel time of 58 seconds at 85° C. and a RT stability of 5–6 days. The stability of the composition at 40° C. was less than 24 hours.

Example 49

49) Composition 49 (Table 4a) was prepared as in example 48 above but with the addition of 2 parts by weight of barbituric acid. Composition 49 (Table 4b) was observed to have a gel time of greater than 300 seconds at 85° C. and a RT stability of greater than 30 days. The stability of the composition at 40° C. was greater than 25 days.

These forty nine compositions, together with certain physical properties, are tabualted in the accompanying Tables 1–4.

As can be seen from the above Examples the stabilisation effect is achieved with even the more reactive latent hardened AJICURE PN-23. AJICURE PN-23 is more reactive than AJICURE PN-H.

II. Physical Properties

We checked each composition for its gel time and room temperature ("RT") stability ('pot life'). A control experiment containing no solid organic acid and using materials from the same resin/polythiol hardener batches was prepared simultaneously and used to compare gel time and stability with the solid organic acid containing composition.

The gel time at 85° C. was determined by applying a dot of the adhesive composition onto a glass microscope slide maintained at a temperature of 85° C. The slide was then placed onto the surface of a thermostatically controlled hot plate maintained at 85° C., from which time the gel time was recorded.

Each composition were then stored at both room temperature and at 40° C. The time required for the initial viscosity of each composition to reach gel point (gellation) was recorded. Viscosity was used to indicate gellation (a point beyond which the composition is unusable).

In the Examples RT is 20–25° C. In the following tables the stability of each composition is measured as "pot-life".

TABLE 1a

| Component Type | Component Identity | Composition No./Amount | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Epoxy Resin | EP 828 | 100 | 100 | 100 | 100 | 100 | 100 | 100 | 100 | 100 | 100 | 100 |
| Polythiol | TMPT | 75 | 75 | 75 | 75 | 75 | 75 | 75 | 75 | 75 | 75 | 75 |
| | PETMP | — | — | — | — | — | — | — | — | — | — | — |
| Latent Hardener | Ajicure PN-23 | — | — | — | — | 25 | 25 | 25 | 25 | 25 | 25 | 25 |
| | Ajicure PN-H | 4 | 4 | 4 | 4 | — | — | — | — | — | — | — |
| Solid organic Acid | Fumaric acid | — | 0.5 | — | — | — | 12 | — | — | — | — | — |
| | Barbituric acid | — | — | 0.5 | — | — | — | 12 | — | — | — | — |
| | 3,4-Dihydroxy benzoic acid | — | — | — | 0.5 | — | — | — | — | — | — | — |
| | Salicylic acid | — | — | — | — | — | — | — | 8 | — | — | — |
| | Phenyl Boronic acid | — | — | — | — | — | — | — | — | 8 | — | — |
| | 5-Phenyl Meldrum's acid | — | — | — | — | — | — | — | — | — | 8 | — |
| | Pamoic acid | — | — | — | — | — | — | — | — | — | — | 8 |

TABLE 1b

| Epoxy Composition | 1 | 2 | 3 | 4 | 5 | 6 | 7 | 8 | 9 | 10 | 11 |
|---|---|---|---|---|---|---|---|---|---|---|---|
| Gel Time @ 85° C. (seconds) | 70 | 90 | 160 | 135–160 | 12 | 50 | 150 | >300 | 120 | >300 | 25 |
| Pot Life @ RT | 30 days | >58 days | >58 days | >42 days | 3–16 hours | >30 days | >30 days | 4–5 days | 4–5 days | >9 days | 6–7 days |
| Pot Life @ 40° C. | 4 days | 11–14 days | >42 days | 18–21 days | <16 hours | >15 days | >12 days | <24 hours | <24 hours | — | — |

TABLE 2a

| Component Type | Component Identity | Composition No./Amount | | | | | | | | | | | | | |
|---|---|---|---|---|---|---|---|---|---|---|---|---|---|---|
| | | 12 | 13 | 14 | 15 | 16 | 17 | 18 | 19 | 20 | 21 | 22 | 23 | 24 | 25 |
| Epoxy Resin | EP 828 | 100 | 100 | 100 | 100 | 100 | 100 | 100 | 100 | 100 | 100 | 100 | 100 | 100 | 100 |
| Polythiol | TMPT | 75 | 75 | 75 | — | — | — | — | — | — | — | — | — | 50 | 50 |
| | PETMP | — | — | — | 33 | 33 | 33 | 33 | 50 | 50 | 50 | 50 | 50 | — | — |
| Latent Hardener | Ajicure PN-23 | 2 | 2 | 2 | 20 | 20 | — | — | 20 | — | — | — | — | 20 | 20 |
| | Ajicure PN-H | — | — | — | — | — | 12 | 12 | — | 8 | 8 | 30 | 30 | — | — |
| Solid Organic Acid | Fumaric acid | — | — | — | — | 8 | — | 4.64 | — | — | — | — | — | — | — |
| | Barbituric acid | — | — | — | — | — | — | — | 4 | — | 3.62 | — | — | — | — |
| | Phloroglucinol | — | 1 | — | — | — | — | — | — | — | — | — | — | — | — |
| | Tartaric acid | — | — | 1 | — | — | — | — | — | — | — | — | — | — | — |
| | 3,4-Dihydroxy cinnamic acid | — | — | — | — | — | — | — | — | — | — | — | 8 | — | — |
| | Trolox | — | — | — | — | — | — | — | — | — | — | — | — | — | 8 |

TABLE 2b

| Property | Composition No. | | | | | | | | | | | | | |
|---|---|---|---|---|---|---|---|---|---|---|---|---|---|---|
| | 12 | 13 | 14 | 15 | 16 | 17 | 18 | 19 | 20 | 21 | 22 | 23 | 24 | 25 |
| Gel Time @ 85° C. (seconds) | 90 | 300 | 200 | 15 | 60 | 35 | 60 | 90 | 30 | 70 | 20 | 120 | 25 | 120 |
| Pot Life @ RT | 2–3 days | 15 days | 10–13 days | <16 hours | 30 days | 4–7 days | >30 days | >17 days | 8 days | >30 days | 3–4 days | 11 days | 3–16 hours | 21 days |
| Pot Life @ 40° C. | <24 hours | — | — | <16 hours | 9 days | 2–4 days | 7 days | >17 days | 2–4 days | 8 days | <16 hours | 6 days | <16 hours | 3–4 days |

TABLE 3a

| Component Type | Component Identity | Composition No./Amount | | | | | | |
|---|---|---|---|---|---|---|---|---|
| | | 26 | 27 | 28 | 29 | 30 | 31 | 32 |
| Epoxy Resin | EP 828 | 100 | 100 | 100 | 100 | 100 | 100 | 100 |
| Polythiol | PETMP | 50 | 50 | 50 | 50 | 50 | 50 | 50 |
| Latent Hardener | Ajicure PN-23 | 20 | 20 | 20 | 20 | 20 | 20 | 20 |
| Solid Organic Acid | 3,4,5-Trimethoxy Benzoic Acid | — | 8 | — | — | — | — | — |
| | Fumaric acid | — | — | 8 | — | — | — | — |
| | 2,3-Dicyano hydroquinone | — | — | — | 8 | — | — | — |
| | Hexa-chlorophene | — | — | — | — | 8 | — | — |
| | 2,2-Dithiosalicylic acid | — | — | — | — | — | 8 | — |
| | 3,4-Dihydroxy cinnamic acid | — | — | — | — | — | — | 8 |

| Component Type | Component Identity | Composition No./Amount | | | | | | | |
|---|---|---|---|---|---|---|---|---|---|
| | | 33 | 34 | 35 | 36 | 37 | 38 | 39 | 40 |
| Epoxy Resin | EP 828 | 100 | 100 | 100 | 100 | 100 | 100 | 100 | 100 |
| Polythiol | PETMP | 50 | 50 | 50 | 50 | 50 | 50 | 50 | 50 |
| Latent Hardener | Ajicure PN-23 | 20 | 20 | 20 | 20 | 20 | 20 | 20 | 20 |
| Solid Organic Acid | 3,4-Dihydroxy benzoic acid | 8 | — | — | — | — | — | — | — |
| | 4,5,7-Trihydroxy flavanone | — | 8 | — | — | — | — | — | — |
| | 3,5-Dinitro salicylic acid | — | — | 8 | — | — | — | — | — |
| | 3,4,5-Trihydroxy benzoic acid | — | — | — | 8 | — | — | — | — |
| | Barbituric acid | — | — | — | — | 8 | — | — | — |
| | Parabanic acid | — | — | — | — | — | 8 | — | — |
| | Tetrahydroxy-p benzoquinone | — | — | — | — | — | — | 8 | — |
| | 4-Nitroguaiacol | — | — | — | — | — | — | — | 8 |

TABLE 3b

| Property | Composition No. | | | | | | |
|---|---|---|---|---|---|---|---|
| | 26 | 27 | 28 | 29 | 30 | 31 | 32 |
| Gel Time @ 85° C. (seconds) | 20 | 200 | 120 | 150 | 30 | 25–30 | 20 |
| Pot Life @ RT | 3–16 hours | 25 days | 48 days | 11 days | 9 days | 11 days | 11 days |

| Property | Composition No. | | | | | | | |
|---|---|---|---|---|---|---|---|---|
| | 33 | 34 | 35 | 36 | 37 | 38 | 39 | 40 |
| Gel Time @ 85° C. (seconds) | 60–90 | 35 | 60–90 | 120 | 90 | 90 | 60 | 60–80 |
| Pot Life @ RT | 13 days | 1.5 days | 4 days | >12 days | >12 days | >12 days | >19 days | 6–7 days |

TABLE 4a

| Component Type | Component Identity | Composition No./Amount | | | | | | | | |
|---|---|---|---|---|---|---|---|---|---|---|
| | | 41 | 42 | 43 | 44 | 45 | 46 | 47 | 48 | 49 |
| Epoxy Resin | RE-310S | 100 | 100 | 100 | 100 | — | — | — | 100 | 100 |
| | EP 828 | — | — | — | — | 100 | 100 | 100 | — | — |
| Polythiol | TMPT | — | — | — | — | 100 | 100 | 100 | 50 | 50 |
| | PETMP | 50 | 50 | 50 | 50 | — | — | — | — | — |
| Latent Hardener | Ajicure PN-23 | 5 | 5 | — | — | — | — | — | 5 | 5 |
| | Ajicure PN-H | — | — | 5 | 5 | 20 | 20 | 20 | — | — |

TABLE 4a-continued

| | | Composition No./Amount | | | | | | | | |
|---|---|---|---|---|---|---|---|---|---|---|
| Component Type | Component Identity | 41 | 42 | 43 | 44 | 45 | 46 | 47 | 48 | 49 |
| Solid Organic Acid | Fumaric acid | — | — | — | — | — | 8 | — | — | — |
| | Barbituric acid | — | 2 | — | 2 | — | — | 8 | — | 2 |

TABLE 4b

| | Composition No. | | | | | | | | |
|---|---|---|---|---|---|---|---|---|---|
| Property | 41 | 42 | 43 | 44 | 45 | 46 | 47 | 48 | 49 |
| Gel Time @ 85° C. (seconds) | 37 | 80 | 55 | 105 | 42 | 54 | 150 | 58 | >300 |
| Pot Life @ RT | <24 hours | >35 days | 4 days | >35 days | 5 days | >30 days | >30 days | 5–6 days | >30 days |
| Pot Life @ 40° C. | <24 hours | 25 days | <24 hours | 25 days | 2 days | 5 days | 6 days | <24 hours | >25 days |

Tables 5a and 5b below set out the shear strengths for the pot lives and gel times compositions 5,6,24,25,26,19,27,30, and 39 above respectively.

We determined the adhesive bond strength by stressing a single adhesive overlap joint with the application of a tensile force parallel to the bond area and to the major axis of the lap shears according to the procedure detailed in internationally recognised test method ASTM D1002. Five tests were conducted for each composition and the result presented in Table 5b is the mean of the five results.

Compositions 5,24 and 26 represent the control compositions. Compositions 6,25,19,27,30 and 39 are compositions of the present invention.

As seen in Table 5b the compositions of the invention form bonds of comparable shear strength compared to the bonds formed by the control compositions. Their gel times remain relatively low, while their pot lives at 25°C.–40° C. show substantial increase.

TABLE 5a

| | | Composition No./Amount | | | | | | | | |
|---|---|---|---|---|---|---|---|---|---|---|
| Component Type | Component Identity | 5 | 6 | 24 | 25 | 26 | 19 | 27 | 30 | 39 |
| Epoxy Resin | EP 828 | 100 | 100 | 100 | 100 | 100 | 100 | 100 | 100 | 100 |
| Polythiol | TMPT | 75 | 75 | 50 | 50 | — | — | — | — | — |
| | PETMP | — | — | — | — | 50 | 50 | 50 | 50 | 50 |
| Latent Hardener | Ajicure PN-23 | 25 | 25 | 20 | 20 | 20 | 20 | 20 | 20 | 20 |
| Solid Organic Acid | Fumaric Acid | — | 12 | — | — | — | — | — | — | — |
| | Barbituric acid | — | — | — | — | — | 4 | — | — | — |
| | Trolox | — | — | — | 8 | — | — | — | — | — |
| | 3,4,5-Trimethoxy benzoic acid | — | — | — | — | — | — | 8 | — | — |
| | Hexachlorophene | — | — | — | — | — | — | — | 8 | — |
| | Tetrahydroxy benzoquinone | — | — | — | — | — | — | — | — | 8 |

TABLE 5b

| | Composition No. | | | | | | | | |
|---|---|---|---|---|---|---|---|---|---|
| Property | 5 | 6 | 24 | 25 | 26 | 19 | 27 | 30 | 39 |
| Gel Time @ 85° C. (seconds) | 12 | 50 | 25 | 120 | 20 | 50–70 | 200 | 30 | 60 |
| Pot Life @ RT | 3–16 hours | >30 days | 3–16 hours | 21 days | 3–16 hours | >17 days | 25 days | >9 days | >19 days |
| Pot Life @ 40° C. | <16 hours | >15 days | — | 3–4 days | <1 day | >17 days | 3 days | 3 days | 12 |
| Shear Strength N/mm$^2$ | 27.2 | 30.02 | 26.18 | 28.78 | 29.19 | 15.41 | 30.43 | 32.02 | 26.57 |

Tables 6a and 6b below set out a composition containing a combination of solid organic acids, Trolox and tetrahydroxy benzoquinone.

We prepared a control composition (composition 1) (Table 6a) containing 100 parts by weight of Epikote 828, 75 parts by weight of trimethylolpropane tris (β-mercaptopropionate), and 25 parts by weight Ajicure PN-23. The composition was tested as before for shear strength, gel time, pot life at RT and pot life at 40° C.

Composition 2 (Table 6a) was prepared as per composition 1 but adding 2 parts by weight Trolox, prior to addition of the hardener.

Composition 3 (Table 6a) was prepared as per composition 1 but adding 1 part by weight tetrahydroxy benzoquinone, prior to addition of the hardener.

The shear strengths, gel times, and pot life at RT and 40° C., for compositions 2 and 3 are also set out in Table 6a.

Composition 4 (Table 6a) was made as per composition 1 but with both 2 parts by weight Trolox and 1 part by weight tetrahydroxy benzoquinone, prior to addition of the hardener.

The shear strength, gel times, and pot life at RT and 40° C. for composition 4 (Table 6a) show an increase in pot life at 40° C. as compared to the control compositions 2 and 3 each containing only one of the solid organic acids.

TABLE 6a

| Component Type | Component Identity | Epoxy Composition No./Amount | | | |
|---|---|---|---|---|---|
| | | 1 | 2 | 3 | 4 |
| Epoxy Resin | EP 828 | 100 | 100 | 100 | 100 |
| Polythiol | TMPT | 75 | 75 | 75 | 75 |
| Latent Hardener | Ajicure PN-23 | 25 | 25 | 25 | 25 |
| Solid Organic Acid | Trolox | — | 2 | — | 2 |
| | Tetrahydroxy Benzoquinone | — | — | 1 | 1 |

TABLE 6b

| Property | Composition No. | | | |
|---|---|---|---|---|
| | 1 | 2 | 3 | 4 |
| Shear Strength N/mm2 | 23.64 | 27.28 | 24.38 | 25.68 |
| Gel Time @85° C. (seconds) | 16 | 28 | 15 | 26 |
| Pot Life @RT | <16 hours | 12–15 days | 25–28 days | 24–25 days |
| Pot Life @40° C. | <16 hours | <2 hours | <2 hours | 4–7 days |

III. Effect of solid organic acid particle size

Tables 7a and 7b refer to a control composition, composition 6 and compositions 6(a) to 6(d) of the invention. We prepared and tested these compositions as described below:

The control composition was prepared as described in Example 5 above. Composition 6 is a composition prepared as described in Example 6 above (having fumaric acid added). The fumaric acid added was as supplied (by Aldrich Chemical Co.) i.e. unground. An analysis of the particle size of the fumaric acid as supplied showed that the solid has a broad range of particle sizes ranging from 0.4 to 400 microns in size. The mean particle size was determined as 108.9 microns.

The compositions 6(a) to 6(d) were prepared as for example 6, (Each composition 6(a) to 6(d) contains fumaric acid which was ground and passed through a series of sieves to obtain ground fumaric acid having a particle size of 53–75 microns. The ground fumaric acid was used in compositions 6(a) to 6(d) inclusively in amounts of 1, 2, 8 and 20 parts by weight of the composition. The gel times and shear strengths were determined as described above.

It can be seen from Table 7 that very low concentrations of finely ground fumaric acid (compositions 6(a), 6(b) and 6(c) in particular) can achieve comparable gel-times, shear strengths and stability to these composition containing higher levels of unground fumaric acid (composition 6). Composition 6(d) in particular illustrates that in order to obtain the best combination of gel-time, stability and bond strengths the particle size should be considered. Acids showing a lesser stabilising effect may have their effect improved without altering the quantity of the solid acid used by reducing the particle size of the solid organic acid by grinding or otherwise.

TABLE 7a

| Component Type | Component Identity | Composition No./Amount | | | | | |
|---|---|---|---|---|---|---|---|
| | | Control | 6 | 6(a) | 6(b) | 6(c) | 6(d) |
| Epoxy Resin | EP 828 | 100 | 100 | 100 | 100 | 100 | 100 |
| Polythiol | TMPT | 75 | 75 | 75 | 75 | 75 | 75 |
| Solid Organic Acid | Fumaric acid (parts) | — | 12 | 1 | 2 | 8 | 20 |
| | Particle Size mm | — | Unground* | 53–75 m | 53–75 m | 53–75 m | 53–75 m |
| Latent Hardener | Ajicure PN-23 | 25 | 25 | 25 | 25 | 25 | 25 |

*Unground refers to material used as received from the supplier.

TABLE 7b

| Property | Composition No. | | | | | |
|---|---|---|---|---|---|---|
| | Control | 6 | 6(a) | 6(b) | 6(c) | 6(d) |
| Gel Time @ 85° C. (seconds) | 16 | 50 | 50 | 120 | 120+ | 120+ |
| Pot Life @ RT | <16 hours | >30 days | 30 days | >30 days | >30 days | >30 days |
| Shear Strength N/mm² | 27.2 | 30.02 | 22.3 | 24.48 | 27.65 | 4.73 |

Tables 8a and 8(b) illustrate how controlling the particle size of barbituric acid affects both stability (pot life) and gel time.

Preparation of compositions

We prepared and tested these compositions as described below: The compositions in Table 8a were prepared by mixing together 100 parts by weight each of epoxy resins EP 828 and EPON 862 and heating the mixture to 60° C. To this mixture was added 25 parts by weight of epoxy resin DEN 438 pre-heated to 60° C. to lower its viscosity. The resins were mixed and 40 parts by weight of trimethylolpropane tris (β-mercaptopropionate) and 125 parts by weight of pentaerythritol tetrakis (b-mercaptopropionate) added and mixed. The mixture was allowed to cool to ambient temperature before addition of the specified amount of barbituric acid. No barbituric acid was added to one of these compositions which was used as a control The barbituric acid was prepared by passing it through a triple roll mill as a 10% dispersion in epoxy resin EP 828. This step reduced the particle size of the barbituric acid. Six compositions 1(a) to 3(b), divided in three pairs, each pair was roll milled acid dispersions with different mean particle sizes (5.54.6.97 and 7.84 micron) were added at either the 0.9 or 1.8 parts by weight level. The latent hardener was then added at a level of 62.3 parts and blended into the mixture. The expression parts by weight relates to parts by weight of the total composition.

Results

Table 8a lists the results of the compositions tested. Each of the compositions showed excellent storage stability as evidenced by the pot life results. The stability is achieved with relatively small amounts of the acid. The results compare favourably to those achieved with the addition of fumaric acid (Table 7). Lesser amounts of barbituric acid of a smaller particle size were observed to give similar results to larger amounts of barbituric acid of larger particle size. All compositions of the invention showed much improved pot lives as compared to the control composition. The results are not adversely affected by the use of two polythiols and three epoxy resins. The gel times are also very favourable as compared to the control composition.

TABLE 8a

| Component Type | Component Identity | Composition No./Amount | | | | | | |
|---|---|---|---|---|---|---|---|---|
| | | Control | 1(a) | 1(b) | 2(a) | 2(b) | 3(a) | 3(b) |
| Epoxy Resin | EP 828 | 100 | 100 | 100 | 100 | 100 | 100 | 100 |
| Epoxy Resin | EPON 862 | 100 | 100 | 100 | 100 | 100 | 100 | 100 |
| Epoxy Novolak | DEN 438 | 25 | 25 | 25 | 25 | 25 | 25 | 25 |
| Polythiol | TMPT | 40 | 40 | 40 | 40 | 40 | 40 | 40 |
| Polythiol | PETMP | 125 | 125 | 125 | 125 | 125 | 125 | 125 |
| Solid Organic Acid | Barbituric acid | — | 0.9 | 1.8 | 0.9 | 11.8 | 0.9 | 1.8 |
| Mean Particle Size mm | | — | 5.54 | 5.54 | 6.97 | 6.97 | 7.84 | 7.84 |
| Latent Hardener | AJICURE PN-23 | 62.3 | 62.3 | 62.3 | 62.3 | 62.3 | 62.3 | 62.3 |

TABLE 8b

| Property | Composition No. | | | | | | |
|---|---|---|---|---|---|---|---|
| | Control | 1(a) | 1(b) | 2(a) | 2(b) | 3(a) | 3(b) |
| Gel Time @ 80° C. (seconds) | 14 | 34 | 45 | 35 | 73 | 25 | 75–80 |
| Pot Life @ RT | <16 hours | >80 days | >80 days | >80 days | >80 days | >80 days | >80 days |
| Pot Life @ 40° C. | <16 hours | 16 days | 17–20 days | 9–14 days | 17–20 days | 8–13 days | 17–20 days |

Tables 9a and 9b further illustrate how controlling the particle size of barbituric acid effects both stability (pot life) and gel time.

Preparation of the compositions

We prepared and tested these compositions as described below: Compositions 2(a) and 2(b) were prepared as in example 7 except unground barbituric acid was replaced with a sample of barbituric acid as a 10% dispersion in epoxy resin EP 828 to reduce the particle size of the acid (as described above). The acid was determined to have a mean particle size of 5.54 micron with greater than 95% confidence limits that all particles are less than 13.4 micron.

Compositions 3(a) and 3(b) were also prepared as in Example 7 except for the use of ground acid with a mean particle size of 14.0 micron with greater than 95% confidence limits that all particles are less than 34.9 micron.

The control composition of Example 5 and the composition of Example 7 are included in Tables 9a and 9b for comparative purposes. The mean particle size of the unground acid was determined to be 45 µm with a broad particle distribution of up to 200 µm.

Results

Table 9a shows that by controlling the particle size of the acid used as a stabiliser, relatively fast gel times can be obtained without compromising the pot life of the system. All compositions show significant improvement over the control composition. The barbituric acid with the reduced particle size in substantially lesser quantities achieves a very significant stabilising effect as compared to the larger particle size.

epoxy novolak resin DEN 438 which had previously been pre-warmed to 60° C. to lower its viscosity. On cooling to ambient temperature, 0.635 parts by weight of barbituric acid was blended into the mixture followed by 20.57 parts by weight of the thixotropy-conferring component AEROSIL 202. Finally 33.26 parts by weight of the latent hardener were added to the composition. The barbituric acid used in each case had a mean particle size of 14.0 µm with 95% confidence that all of the acid had a particle size of less than 34.9 µm.

Shear strength was measured by the method described above.

Results

Compositions 1 and 2 both demonstrate very good stability and both form bonds having good shear strengths. The Yield Point and viscosity of the two compositions remain at desirable levels throughout the duration of the tests.

Figure 4A:
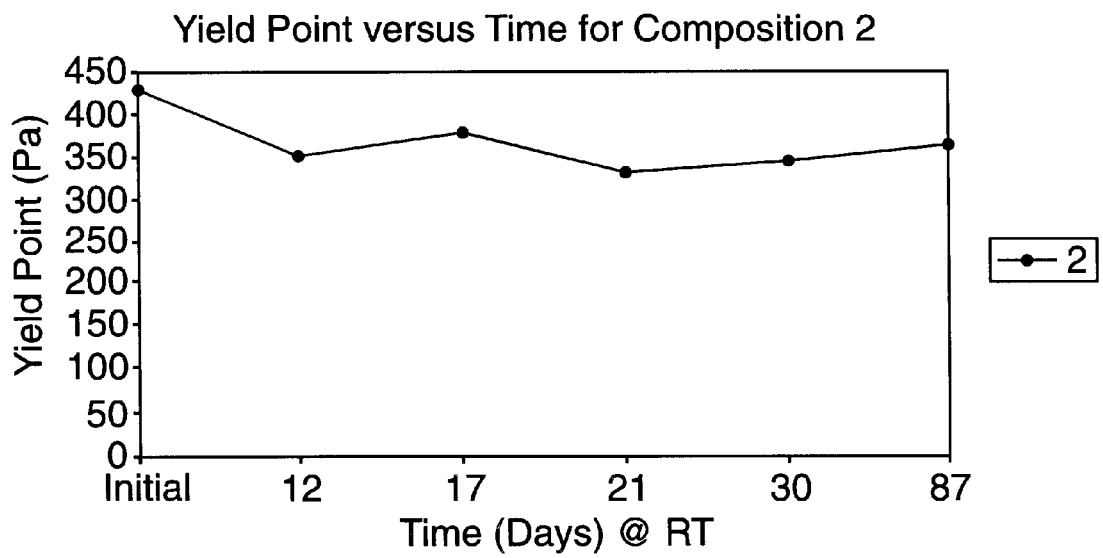
FIG. 4A depicts a plot of yield point over time for a sample composition (Composition 2 of Table 10a below) in accordance with the first aspect of the invention, and including a thixotropy-conferring component.
Figure 4B:
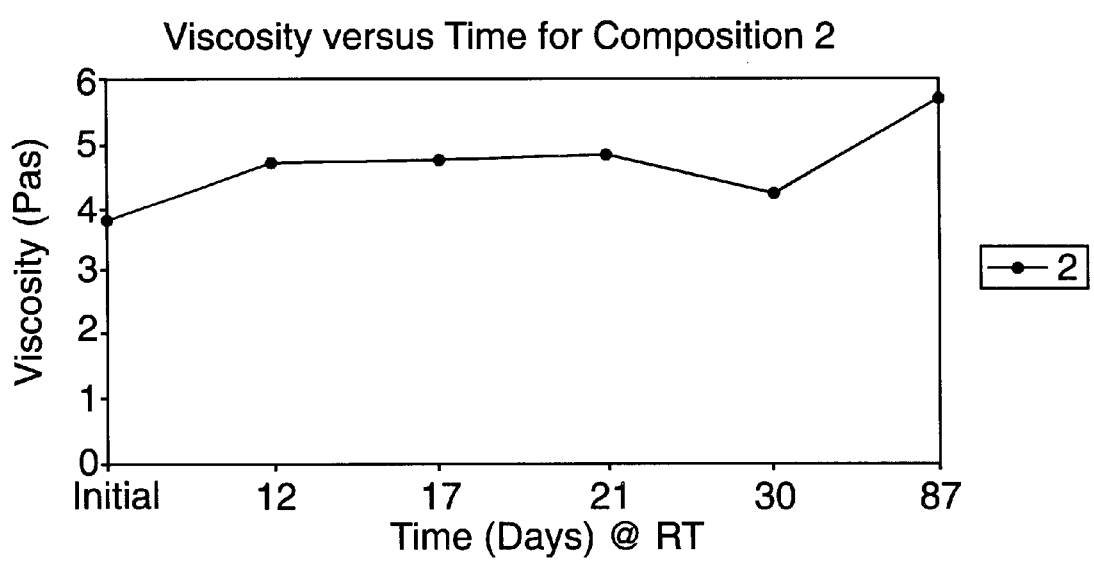
FIG. 4B depicts a plot of viscosity over time for the same sample composition (Composition No 104 of Table 13 below) in accordance with a first aspect of this invention, and including a thixotropy-conferring component.

The values give in Table 10c are plotted in FIGS. 4A and 4B. A control composition without barbituric acid added was prepared. Comparative data with the control composition is TABLE 9a

| | | Composition No./Amount | | | | | |
|---|---|---|---|---|---|---|---|
| Component Type | Component Identity | Control Ex. 5 | Example 7 | 2(a) | 2(b) | 3(a) | 3(b) |
| Epoxy Resin | EP 828 | 100 | 100 | 100 | 100 | 100 | 100 |
| Polythiol | TMPT | 75 | 75 | 75 | 75 | 75 | 75 |
| Solid Organic Acid | Barbituric Acid | — | 12 | 0.25 | 0.50 | 0.2 | 0.4 |
| Mean Particle Size mm | | — | 45 | 5.54 | | 14.0 | |
| Latent Hardener | AJICURE PN-23 | 25 | 25 | 25 | 25 | 32 | 25 |

TABLE 9b

| | Composition No. | | | | | |
|---|---|---|---|---|---|---|
| Property | Control | Ex 7 | 2(a) | 2(b) | 3(a) | 3(b) |
| Gel Time @ 85° C. (Seconds) | 12 | 150 | 47 | 75–80 | 10–12 | 12–16 |
| Pot Life @ RT | 3–16 hours | >30 days | 140 days | 140 days | 90 days | 100 days |
| Pot Life @ 40° C. | <16 hours | >12 days | 15 days | 30–34 days | 30 | 31 |

IV. Experimental data relating to compositions containing both a polythiol and a thixotropy-conferring component Tables 10a and 10b demonstrate further the effect of particle size on the pot life of two compositions and the shear strength of bonds formed using these compositions. Table 10c gives the rheological properties of the compositions. The data is plotted on FIGS. 4A and 4B.

Preparation

We prepared and tested these compositions as described blow: Composition 1 (Table 10a/b) was prepared by mixing 100 parts epoxy resin EP 828 and 75 parts trimethylolpropane tris(b-mercaptopropionate). This was followed by addition and dispersion of 0.50 parts by weight of barbituric acid. 15.6 parts by weight of the thixotropy-conferring component AEROSIL 202 were then added to the composition. Finally 25 parts by weight of the latent hardener were added.

Composition 2 was prepared by mixing 100 parts epoxy resin EP 828 and 94.5 parts trimethylolpropane tris(b-mercaptopropionate). The temperature of the mixture was raised to 60° C. before addition of 30.26 parts by weight of not given as the control had a viscosity which rendered it unusable after 16 hours and was not therefore useful for inclusion in Tables 10a–c or FIGS. 4A or 4B.

TABLE 10a

| | Composition No./Amount | | |
|---|---|---|---|
| Component Type | Component Identity | 1 | 2 |
| Epoxy Resin | EP 828 | 100 | 100 |
| Epoxy Novolok | DEN 438 | — | 30.26 |
| Latent Hardener | AJICURE PN-23 | 25 | 33.26 |
| Thixotrope | AEROSIL 202 | 15.6 | 20.57 |
| Polythiol | TMPT | 75 | 94.5 |
| Solid Organic Acid | Barbitaric Acid | 0.50 | 0.635 |

TABLE 10b

| | Composition No. | |
|---|---|---|
| Property | 1 | 2 |
| Gel Time @85° C. (Seconds) | 12–14 | 13–15 |
| Pot Life @RT (Days) | >156 | >100 |
| Pot Life @40° C. (Days) | 28 | 21 |
| Shear Strength N/mm² | 28.59 | 29.5 |

TABLE 10c

Composition No. 2

| Time (Days) @RT | Yield Point (Pa) | Viscosity (Pa s) |
|---|---|---|
| Initial | 431 | 3.802 |
| 12 | 351.2 | 4.759 |
| 17 | 378.5 | 4.784 |
| 21 | 330.9 | 4.896 |
| 30 | 342.8 | 4.28 |
| 87 | 360.4 | 5.7 |

V. Rheological Stability

The rheology of epoxy resin composition dispensed should be suitably adjusted so as to provide the desired dot profile. In addition, the amount dispensed should also be adjusted according to the electronic component design parameters. Such adjustments are left to those persons of ordinary skill in the art, and of course depend upon the specifications set by the end-user of the composition.

In a chip bonding application the compositions of the invention comprising a thixotropy-conferring component may be advantageously deposited in a three dimensional manner when employed with the stencil provided by European Patent No. 770 006, the disclosure of which is hereby expressly incorporated herein by reference. In this way, not only are two-dimensional deposits produced in accordance with the location and density of holes in the stencil, but also their heights may vary over the pattern area. This is particularly attractive when mounting electronic components because of often times the components have different stand-off heights and the electrodes may be separated from one another by different distances.

The importance of the shape of the adhesive dot can be seen with reference to FIGS. 1 and 2. In a typical commercial application of such an epoxy-based adhesive composition to surface mount the chip onto the pcb, the dot should be high enough off the substrate or chip surface to contact the to-be-surface-mounted chip, but not so high that it would fall over to forming a tail which may block the solder lands.

The shape of the dot may be adjusted by the addition of suitable structure-building agents, such as the thixotropy-conferring components discussed herein. An epoxy composition that may be dispensed over the entire period of its shelf life to give reliable and reproducible dot shapes is achieved by employing a composition that maintains its yield point over time.

For instance, most commercially-available epoxy-based compositions should be stored according to manufactuer's recommendations at or blow 5° C. and used within 6–9 months of manufacture. In the event that such storage and usage conditions have not been met, dispensing problems may be encountered with conventional adhesives whose rheological properties may have changed as a result of not complying with those recommendations. As such, a dispensed dot of adhesive may tend to spread in shape and therefore not meet the desired dot profile specified for the particular commercial application. Such an adhesive therefore has not maintained its yield point over time. The compositions of this invention are less prone to suffer from yield point decreases or viscosity increases in the likely event that the end user fails to employ the compositions in accordance with the manufacturer's recommended storage and use conditions.

As the dot shape loses its height (which was chosen to bond the chip, at a particular stand-off height), it broadens its base to block the solder lands. Solder land blockage by the adhesive would cause electrical discontinuation in the so-formed surface mount device, thereby creating a failure and, as importantly, interruption in the fabrication cycle.

VI. Preparation of Epoxy-based Compositions

We prepared compositions in accordance with the second aspect of this invention, and we also prepared known epoxy resin compositions to compare their observed rheological properties, such as yield point and viscosity over time. Most of the reported information is taken from room temperature observations, although some of the information is taken from accelerated ageing conditions (at a temperature of about 40° C.) to provide guidance as to how an adhesive composition may fare in the marketplace.

More specifically, we prepared epoxy resin compositions with the following components in the indicated amounts below in Table 11.

TABLE 11

| | Composition No./ Amount (Parts) | |
|---|---|---|
| Component | 101 | 102 |
| Epoxy | 131 | 131 |
| AJICURE PN-23 | 45 | 45 |
| AEROSIL 202 | 25 | 25 |
| Barbituric acid | — | 2 |

These compositions were prepared by mixing the epoxy component, the thixotropy-conferring component and the solid organic acid together in a vessel under ambient temperature conditions for a period of time of about 2 hours. Thereafter, the latent hardened component was added. A vacuum is applied to the mixing vessel at appropriate times during sample composition preparation in order to de-aerate the compositions. Mixing is allowed to continue, under intermittent vacuum, under the ambient temperature conditions for a period of time of about 3 hours.

We measured initially for Composition Nos. 101 and 102 flow curves using a Haake cone and plate viscometer (Model No. Haake PK 100, Karlsruhe, Germany), together with curve-fitting software (Rotovisco, RV20, ver. ROT 2.4.3.) provided with the viscometer, to determine the yield point and viscosity of the compositions. The shear stress on the compositions is measured as a function of shear rate and the data is fitted to the Casson mathematical mode using the curve-fitting software from which the yield point and viscosity are determined. The Haake PK 100 system is set up using the above head and cone, the composition is loaded and excess material is removed. The composition is allowed to equilibrate to the test temperature of 25 deg. C. for 5 minutes and then the composition is reconditioned by running a stress/time ramp for 5 minutes at 0.5 $S^{-1}$. Immediately following the conditioning period a stress/shear rate flow curve from 0.3 $s^{-1}$ to 40 $s^{-1}$ is run for 6 minutes, collecting 40 data points. The data is then stored. A plot of shear stress (Pa) versus shear rate ($s^{-1}$) on the log scale is made before carrying out a regression using the Casson model over the range 0.4 to 30.0 $s^{-1}$. The regression range should be limited to the region before the onset of shear fracture (if present). This analysis will give the Casson yield value (Pa) and the Casson infinite shear viscosity (Pa.s). The correlation measured should be 0.98 or greater.

We then filtered Composition Nos. 101 and 102, and again measured flow curves. Yield point ordinarily is observed to drop after filtering. Filtering is important in the preparation of chipbonding adhesives, or for that matter any adhesive to be dispensed from a narrow gauge tip, because of the possibility of blocking the dispensing pathway with for instance deleterious material. We then stored the compositions at room temperature and measured their flow curves at weekly intervals over a period of time of about 18 weeks. This information is recorded below in Table 12.

TABLE 12

| Time (Days) @25° C. | Composition No. | | | |
|---|---|---|---|---|
| | 101 | | 102 | |
| | Yield Point (Pa) | Visc. (Pa · s) | Yield Point (Pa) | Visc. (Pa · s) |
| Mix Initial | 446.3 | 3.512 | 889.2 | 3.943 |
| Filtration | 418.5 | 3.626 | 737.8 | 4.646 |
| 7 | 312.9 | 4.260 | 664.2 | 6.666 |
| 14 | 269.3 | 5.313 | 752.5 | 0.911 |
| 21 | 207.7 | 6.531 | 785.4 | 5.137 |
| 28 | 253.0 | 5.976 | 817.8 | 5.080 |
| 35 | 225.3 | 6.490 | 889.8 | 4.826 |
| 42 | 222.0 | 7.343 | 839.9 | 4.492 |
| 49 | 224.0 | 6.511 | 852.0 | 5.659 |
| 70 | 251.9 | 7.119 | 843.7 | 5.938 |
| 84 | 233.7 | 6.795 | 757.8 | 8.031 |
| 98 | 202.6 | 8.832 | 883.6 | 4.757 |
| 126 | 202.5 | 11.460 | 908.9 | 5.888 |

However, because Composition Nos. 101 and 102 exhibited different yield point initial values (446.3 and 889.2 Pa, respectively), we prepared Composition Nos. 103, 104 and 105 for further comparative purposes, with Composition No. 105 containing a higher level of the silica component i.e. 28.5 parts.

TABLE 13

| Component | Composition No./Amount (Parts) | | |
|---|---|---|---|
| | 103 | 104 | 105 |
| Epoxy | 131 | 131 | 131 |
| AJICURE PN-23 | 45 | 45 | 45 |
| AEROSIL 202 | 25 | 25 | 28.5 |
| Barbituric acid | — | 1 | — |

Figure 5:
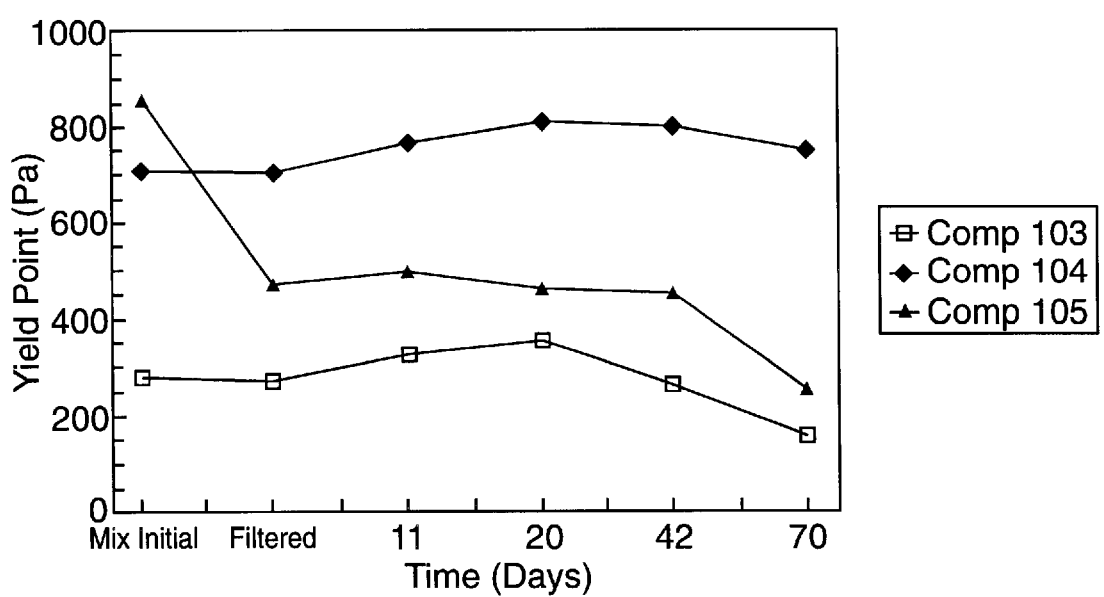
FIG. 5 depicts a plot of yield point over time for a sample composition (Composition 104 of Table 13) in accordance with a second aspect of this invention as contrasted to two comparative compositions (Composition 103 and 105 of Table 13).

Composition No. 105 (having an enhanced silica level) exhibited an initial yield point of 855.5 Pa, which is comparable to that exhibited initially by Composition No. 104. We then filtered the compositions, measured their flow curves, and stored the compositions at room temperature. We measured their flow curves at weekly intervals over a period of time of about 70 days. These results are presented below in Table 14, and may be more fully appreciated with reference to FIG. 5.

TABLE 14

| Time(Days) @ 25° C. | Composition No. | | | | | |
|---|---|---|---|---|---|---|
| | 103 | | 104 | | 105 | |
| | Yield Point (Pa) | Visc. (Pa · s) | Yield Point (Pa) | Visc. (Pa · s) | Yield Point (Pa) | Visc. (Pa · s) |
| Mix Initial | 279.1 | 6.438 | 711.6 | 4.960 | 855.5 | 2.925 |
| Filtration | 271.1 | 7.178 | 708.3 | 4.678 | 467.9 | 5.667 |
| 11 | 328.1 | 7.496 | 768.1 | 4.987 | 498.1 | 4.676 |
| 20 | 356.0 | 6.461 | 812.7 | 5.371 | 462.3 | 5.235 |
| 42 | 266.4 | 8.804 | 805.9 | 5.969 | 453.9 | 5.984 |
| 70 | 158.1 | 12.44 | 754.6 | 7.498 | 256.7 | 11.09 |

The yield points for Composition Nos. 103 and 105 (each of which are free of the solid organic acid component) show a marked decline at room temperature over time. (See FIG. 5.) Composition No. 104 (with the solid organic acid component), on the other hand, shows a yield point that is maintained at substantially the same level over time. (See FIG. 5.) Composition No. 105 shows the decrease in yield point more clearly than Composition No. 103, as the yield point of Composition No. 105 was established initially at a level comparable to that of Composition No. 104 by virtue of the additional silica added as a thixotropy-conferring component.

For certain high speed dispensing applications, chipbonder adhesives should have a yield point within the range of from about 150–450 Pa (see below Table 15, Composition Nos. 106 and 107).

With that application in mind, two additional compositions were prepared with their components (and amounts) and their rheological properties given below in Tables 15 and 16, respectively.

TABLE 15

| Component | | Composition No./ Amount (Parts) | |
|---|---|---|---|
| Type | Individual | 106 | 107 |
| Epoxy | EPON 862 | 100 | 100 |
| | DEN 438 | — | 21.67 |
| | CARDURA E10 | 50 | 50 |
| Latent hardener | AJICURE PN-23 | 42.36 | 42.36 |
| Thixotrope | AEROSIL 202 | 19.26 | 19.26 |
| Solid organic acid | Barbituric acid | 1 | 1 |
| Pigment | STANTONE 28EPX01 Red | 4.32 | 4.32 |

TABLE 16

| Time (Days) @25° C. | Composition No. | | | |
|---|---|---|---|---|
| | 106 | | 107 | |
| | Yield Point (Pa) | Visc. (Pa · s) | Yield Point (Pa) | Visc. (Pa · s) |
| Mix Initial | 340.8 | 1.097 | 390.1 | 3.18 |
| Filtration | 343.7 | 1.076 | 367.2 | 3.006 |
| 14 | 339.2 | 1.108 | — | — |
| 21 | — | — | 323.9 | 3.355 |
| 26 | 370.9 | 0.969 | — | — |
| 28 | — | — | 345.1 | 3.093 |
| 32 | 362.3 | 0.9441 | 339.2 | 3.029 |
| 51 | 370.2 | 1.017 | — | — |

In Table 17, two compositions are shown, one of which contains as a solid organic acid component fumaric acid (Composition No. 108) and the other (Composition No. 109) contains no such solid organic acid and is presented for comparative purposes to show the lack of yield point maintenance over time. (See below Table 18.)

TABLE 17

| Component | | Composition No./ Amount (Parts) | |
|---|---|---|---|
| Type | Individual | 108 | 109 |
| Epoxy | EPON 862 | 100 | 100 |
| | CARDURA E10 | 50 | 50 |
| Latent hardener | AJICURE PN 23 | 42.36 | 42.6 |
| Thixotrope | AEROSIL 202 | 19.26 | 23 |
| Solid organic acid | Fumaric acid | 1 | — |
| Pigment | STANTONE 28EPX01 Red | 4.32 | 4.32 |

TABLE 18

| | Composition No. | | | |
|---|---|---|---|---|
| | 108 | | 109 | |
| Time (Days) @ 25° C. | Yield Point (Pa) | Viscosity (Pa.s) | Yield Point (Pa) | Viscosity (Pa.s) |
| Mix Initial | 482.5 | 0.8948 | 355.7 | 0.464 |
| Filtration | 429.9 | 1.12 | 355.4 | 0.674 |
| 1 | — | — | 300.6 | 0.453 |
| 3 | 491.3 | 0.956 | — | — |
| 4 | 500.7 | 1.083 | — | — |
| 5 | 467.2 | 0.930 | 229.9 | 0.465 |
| 6 | 454.2 | 0.828 | 210.2 | 0.462 |
| 7 | — | — | 162.5 | 0.524 |

VII. Physical Properties
A. Accelerated Ageing Data

We conditioned Composition No. 106 at a temperature of about 40° C. to determine the affect of an increase of temperature over time. The results are presented below in Table 19.

TABLE 19

| | Composition No. 106 | |
|---|---|---|
| Time (Days) @ 40° C. | Yield Point (Pa) | Visc. (Pa.s) |
| Mix Initial | 340.8 | 1.097 |
| Filtration | 343.7 | 1.076 |
| 3 | 430.0 | 0.837 |
| 6 | 395.8 | 0.917 |
| 10 | 434.4 | 0.970 |
| 18 | 437.0 | 1.042 |

From the results presented in this table, it is seen that compositions in accordance with this invention perform well over time, even at elevated temperature conditions, such as may be experienced when the end user does not follow the manufacturer's recommended use and storage conditions.

B. Shear Strength

The adhesive composition (Composition No. 106) was dispensed onto lap shears which are constructed of grit-blasted mild steel and cured at a temperature of about 150° C. for a period of time of about 30 minutes. The lap shears with the cured adhesive between an overlapping portion thereof was then maintained at room temperature for a period of time of about 24 hours.

The adhesive bond strength is determined by stressing a single adhesive overlap joint with the application of a tensile force parallel to the bond area and to the major axis of the lap shears according to the procedure detailed in internationally-recognized text method ASTM D1002. Five test specimens were evaluated for Composition No. 106 and the results obtained as a mean of the five observations show an adhesive shear strength of 24.89 N/mm$^2$.

Notwithstanding the detailed description of the invention given above, the true spirit and scope of the invention is measured by the claims.

What is claimed is:

1. A one part epoxy resin composition comprising:

(a) an epoxy compound which has two or more epoxy groups per molecule;

(b) a polythiol compound which has two or more thiol groups per molecule;

(c) a latent hardener; and (d) at least one solid organic acid substantially insoluble in a mixture of (a), (b) and (c) above, at room temperatures within the range of about 15° C. to 35° C. and which remains substantially insoluble in effective amounts at temperatures below the elevated activation temperatures at which cure of the composition is initiated, which is selected from the group consisting of:

(i) solid organic acids having a pKa of less than or equal to about 12.0; and (ii) aliphatic, cycloaliphatic and aromatic carboxylic acids and derivatives thereof, aliphatic, cycloaliphatic and aromatic quinones and derivatives thereof, phenols and derivatives thereof and enolisable aliphatic, cycloaliphatic and aromatic compounds and derivatives thereof and combinations thereof.

2. The composition according to claim 1, wherein the solid organic acid selected is a member selected from the group consisting of:

(i) carboxylic acids within general Formula I, R$_1$CO$_2$H, wherein R$_1$ is a member selected from the group consisting of trans-CH=CHCO$_2$H; —CH=CHCO$_2$R[R is CH$_3$]; —H$_2$C(OR') (CO$_2$R") CH$_2$CO$_2$R"' [R' is H, C$_1$–C$_{10}$ alkyl, Ar; R" is H, C$_1$–C$_{10}$ alkyl, Ar]; [R"' is H, C$_1$–C$_{10}$ alkyl, Ar]; C$_{11}$–C$_{18}$ alkyl; —(CH$_2$)$_n$CO$_2$H[n is 1–9]; —(CHR)$_n$CO$_2$H [R is H, OH, n is 1 or 2]; —CH(OR')R"[R' is H, alkyl, R" is C$_1$–C$_{10}$ alkyl, Ph]; —CH=CH—Ar;

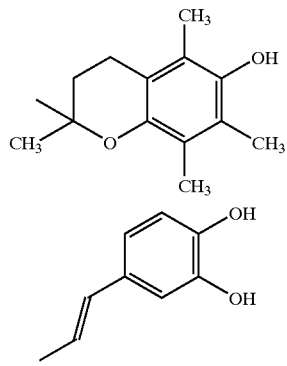

(ii) benzoic acids within general Formula II:

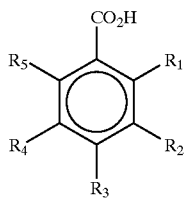

wherein
R₁ is a member selected from the group consisting of H; alkyl; haloalkyl; alkenyl; OR[R is alkyl, Ph, Bn, Ar]; —S—S—Ar—CO₂H; —S—S—Ar; —SR[R is H, alkyl, haloalkyl, Ph, Bn, Ar]; Ph; Bn; Ar; CO₂R[R is H, alkyl, Ph, Bn, Ar]; CO.R[R is H, alkyl, Ph, Bn, Ar]; and NO₂;

R₂ is a member selected from the group consisting of H; alkyl; haloalkyl; alkenyl; Ph; Bn; Ar; OR[R is alkyl, Ph, Bn, Ar]; NO₂; CO.R[R is C₁–C₁₀ alkyl, Ph, Bn, Ar]; CHO; CO₂R[R is H, alkyl, haloalkyl, Ph, Bn, Ar], or

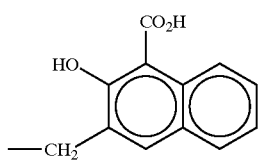

R₃ is a member selected from the group consisting of H; alkyl; haloalkyl; alkenyl; OR[R is alkyl, Ph, Bn, Ar] Ph; Bn; Ar; CHO; CO.R[R is alkyl, Ph, Bn, Ar]; CO₂R[R is H, alkyl, Ph, Bn, Ar]; NO₂;

R₄ is a member selected from the group consisting of H; alkyl; haloalkyl; alkenyl; OR[R is alkyl, Ph, Bn, Ar]; NO₂; CO.R[R is alkyl, Ph, Bn, Ar]; CHO, CO₂R[R is H, alkyl, Ph, Bn, Ar]; Ph; Bn; or Ar; and R₅ is a member selected from the group consisting of H; alkyl; haloalkyl; alkenyl; OR[R is alkyl, Ph, Bn, Ar]; Ph; Bn; Ar; CHO; CO.R[R is alkyl, Ph, Bn, Ar]; CO₂R[R is H, alkyl, Ph, Bn, Ar]; NO₂;

(iii) quinones within general Formula III:

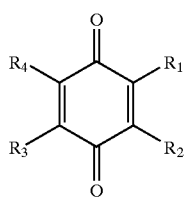

wherein R₁, R₂, R₃ and R₄ are independently selected from the group consisting of H; alkyl; haloalkyl; alkenyl; OR[R is H, alkyl, Ar, Ph, Bn]; CN; Ph; Ar; or (iv) phenols within general Formula IV:

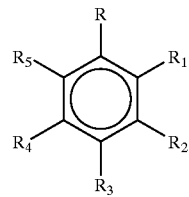

wherein
R is a member selected from the group consisting of H, OH; R₁ is H, alkyl, haloalkyl; alkenyl; halo; CN; OH; OR[R is alkyl, Ph, Bn, Ar]; NO₂; CO.R[R is alkyl, Ph, Bn, Ar]; CHO; CO₂R[R is H, alkyl, Ph, Bn, Ar]; PhOH;

R₂ is a member selected from the group consisting of H; alkyl; haloalkyl; alkenyl; OH; OR[R is alkyl, Ph, Bn, Ar]; Ph; Bn; CN; halo;

R₃ is a member selected from the group consisting of H; alkyl; haloalkyl; alkenyl; NO₂; CO.R[R is alkyl, Ph, Bn, Ar]; CHO; CO₂R[R is alkyl, Ph, Bn, Ar]; OH; OR[R is alkyl, Ph, Bn, Ar]; Ar; Bn; Ph; C(R)₂PhOH[R is Me, H]; C(R)₂Ar[R is Me, H];

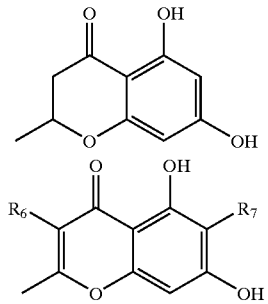

wherein R₆ and R₇ are independently H; alkyl; haloalkyl; alkenyl; OH; OR[R is alkyl, Ph, Bn, Ar];

R₄ is a member selected from the group consisting of H; alkyl; haloalkyl; alkenyl; OH; OR[R is alkyl, Ph, Bn, Ar]; halo; CN; Ph; Bn; —CH₂Ar; and R₅ is a member selected from the group consisting of H, alkyl, haloalkyl; alkenyl; halo; CN; OH; OR[R is alkyl, Ph, Bn, Ar]; NO₂; CO.R[R is alkyl, Ph, Bn, Ar,]; CHO; CO₂R[R is H, alkyl, Ph, Bn, Ar]; PhOH, provided that a compound within general Formula IV is chosen to have at least one phenolic group present, or (v) enolisable materials within general Formula V:

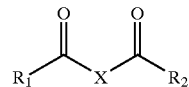

wherein R₁ or R₂ are NR'CO.NR"R'" [R' is H, alkyl, Ph, Ar; R" is H, alkyl, Ph, Ar; R'" is H, alkyl, Ph, Ar]; OR[R is H, alkyl, Ph, Ar]; and X is (CH₂)ₙ; C(R)₂[R is alkyl, Ph, Ar, CN]; O; S; NR[R is H, alkyl, Ph, Ar]; and n is 0–10, or (vi) enolisable materials within general Formula VI:

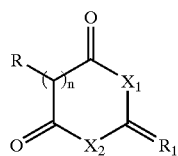

wherein (a) $X_1$ and $X_2$ are each NH, R is H, $R_1$ is O, and n=1; (b) $X_1$ and $X_2$ are each NH, $R_1$ is O, and n is zero so that the cyclic structure has a five membered ring; (c) $X_1$ and $X_2$ are each O, R is H, $R_1$ is $(CH_3)_2$, and n is 1; or (d) $X_1$ and $X_2$ are each O, R is Ph, $R_1$ is $(CH_3)_2$, and n is 1.

3. The composition according to claim 1, wherein the solid organic acid is selected from the group consisting of: 4-nitroguaiacol, 3,4,5-trimethoxy benzoic acid, hexachlorophene, 4,5,7-trihydroxyflavanone, phloroglucinol, fumaric acid, 3,4-dihydroxy benzoic acid, 3,4,5-trihydroxy benzoic acid, 6-hydroxy-2,5,7,8-tetramethylchroman-2 carboxylic acid, pamoic acid, ascorbic acid, citric acid, 3,4-dihydroxy cinnamic acid, 2,3-dicyanohydroquinone, barbituric acid, tetrahydroxy-p-benzoquinone, parabanic acid, phenyl boronic acid, 5-phenyl Meldrum's acid, Meldrum's acid, and combinations thereof.

4. The composition according to claim 1, wherein the epoxy compound is a polymeric epoxide having an average of two or more epoxide groups per molecule selected from the group consisting of polyglycidyl ethers of bisphenol A, bisphenol F, bisphenol AD, catechol, resorcinol, or epoxy compounds obtained by reacting polyhydric alcohols with epichlorohydrin, epoxidised olefinic resins, epoxidized phenolic novolac resins, epoxidized cresol novolac resins, cycloaliphatic epoxy resins, polyglycidyl ether esters, polyglycidyl esters, urethane modified epoxy resins, polyepoxy compounds based on aromatic amines and epichlorohydrin, and combinations thereof.

5. The composition according to claim 1, wherein the polythiol compound is selected from mercapto compounds which have two or more thiol groups per molecule.

6. The composition according to claim 1, wherein the polythiol compound is selected from the group consisting of trimethylolpropane tris (β-mercaptopropionate), trimethylolpropane tris (thioglycolate), pentaerythritol tetrakis (thioglycolate), pentaerythritol tetrakis (β-mercaptopropionate), dipentaerythritol poly (β-mercaptopropionate), ethylene glycol bis (β-mercaptopropionate), alkyl polythiols, aromatic polythiols and combinations thereof.

7. The composition according to claim 1, wherein the ratio of the epoxy compound to the polythiol compound in the composition is such that the ratio of epoxy equivalents to thiol equivalents is from about 0.5:1 to about 1.5:1.

8. The composition according to claim 1, wherein the latent hardener (c) is present in amounts of about 1 to about 60 parts by weight per 100 parts by weight of the epoxy compound (a).

9. The composition according to claim 1, wherein the solid organic acid is present in an amount of about 0.1 to about 80 parts by weight per 100 parts by weight of the latent hardener (c).

10. The composition according to claim 1, wherein the solid organic acid has a mean particle size in the range about 0.1 to about 500 microns.

11. The composition according to claim 1, wherein the solid organic acid has a pKa less than or equal to about 10.

12. The composition according to claim 1, in a one-part form.

13. The composition according to claim 1, further comprising: (e) a thixotropy-conferring component.

14. The composition according to claim 1, which is a curable one-part epoxy resin composition suitable for use as an adhesive to mount electronic components on a substrate.

15. The composition according to claim 13, which is a curable one-part epoxy resin composition suitable for use as an adhesive to mount electronic components on a substrate.

16. The composition according to claim 1, which is a curable one-part epoxy composition capable of sealing underfilling between a semiconductor device including a semiconductor chip mounted on a carrier substrate and a circuit board to which said semiconductor device is electrically connected.

17. A method of stabilizing a one-part epoxy resin composition comprising adding at least one solid organic acid (d) having a pKa of less than or equal to about 12.0 to a one-part adhesive composition comprising (a) an epoxy compound having two or more epoxy groups per molecule, (b) a polythiol compound having two or more thiol groups per molecule, and (c) a latent hardener, and, optionally, (e) a thixotropy-conferring component, wherein the solid organic acid is substantially insoluble in the mixture of (a), (b) and (c) at room temperatures within the range of from about 15° C. to 35° C. and which remains substantially insoluble in effective amounts at a temperature below the elevated activation temperature at which cure of the composition is initiated.

* * * * *